(12) United States Patent
Kihara et al.

(10) Patent No.: US 7,215,061 B2
(45) Date of Patent: May 8, 2007

(54) MICROMECHANICAL ELECTROSTATIC RESONATOR

(75) Inventors: Ryuji Kihara, Hachioji (JP); Takuya Nakajima, Ushiku (JP); Makoto Furuhata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 240 days.

(21) Appl. No.: 10/990,411

(22) Filed: Nov. 18, 2004

(65) Prior Publication Data

US 2005/0151442 A1 Jul. 14, 2005

(30) Foreign Application Priority Data

| Dec. 4, 2003 | (JP) | ............................. 2003-405839 |
| Feb. 16, 2004 | (JP) | ............................. 2004-038468 |
| Feb. 27, 2004 | (JP) | ............................. 2004-054180 |
| Feb. 27, 2004 | (JP) | ............................. 2004-054182 |
| Aug. 25, 2004 | (JP) | ............................. 2004-244835 |

(51) Int. Cl.
*H02N 1/00* (2006.01)
*H03H 9/00* (2006.01)
*H01L 29/00* (2006.01)

(52) U.S. Cl. ..................................... 310/309; 333/199
(58) Field of Classification Search ................. 310/309
See application file for complete search history.

(56) References Cited

U.S. PATENT DOCUMENTS

| 6,369,374 | B1 | 4/2002 | Greywall ................. 250/201.1 |
| 6,628,177 | B2* | 9/2003 | Clark et al. ................. 333/186 |
| 6,894,586 | B2* | 5/2005 | Bircumshaw et al. ....... 333/133 |
| 6,985,051 | B2* | 1/2006 | Nguyen et al. ............. 333/186 |
| 7,023,065 | B2* | 4/2006 | Ayazi et al. ................. 257/414 |
| 2002/0070816 | A1* | 6/2002 | Hsu et al. .................... 331/154 |
| 2005/0124135 | A1* | 6/2005 | Ayazi et al. ................. 438/424 |
| 2005/0206479 | A1* | 9/2005 | Nguyen et al. ............. 333/186 |

FOREIGN PATENT DOCUMENTS

WO WO 02/17482 A2 2/2002

OTHER PUBLICATIONS

Tang et al.; "Laterally Driven Polysilicon Resonant Microstructures," Sensors and Actuators, 20 (1989), pp. 25-32.
Wan-Thai Hsu et al.; "Q-Optimized Lateral Free-Free Beam Micromechanical Resonators," Digest of Technical Papers, the 11th Int. Conf. On Solid-State Sensors and Actuators (Transducers '01), Munich, Germany, Jun. 10-14, 2001, pp. 1110-1113.
John R. Clark, "High-Q VHF Micromechanical Contour-Mode Disk Resonators," Technical Digest, IEEE Int. Electron Devices Meeting, San Francisco, California, Dec. 11-13, 2000, pp. 399-402 Center for Integrated Microsystems.

* cited by examiner

*Primary Examiner*—Burton Mullins
(74) *Attorney, Agent, or Firm*—Oliff & Berridge, PLC

(57) ABSTRACT

Exemplary embodiments of the invention provide a micromechanical electrostatic resonator which designs high frequency, increases a ratio of output voltage to input voltage, and designs low drive voltage or reduced power consumption. A micromechanical electrostatic resonator of exemplary embodiments includes a plate-shaped vibration body, a pair of electrodes arranged oppositely to each other at both sides of the vibration body with a gap from an outer circumferential portion of the vibration body, a feeding device to apply in-phase alternating-current power to the pair of electrodes, and a detecting device to obtain an output corresponding to a change in capacitance between the vibration body and the electrodes. The planar shape of the vibration body takes a shape having a curved outline which comprises a neck portion.

10 Claims, 24 Drawing Sheets

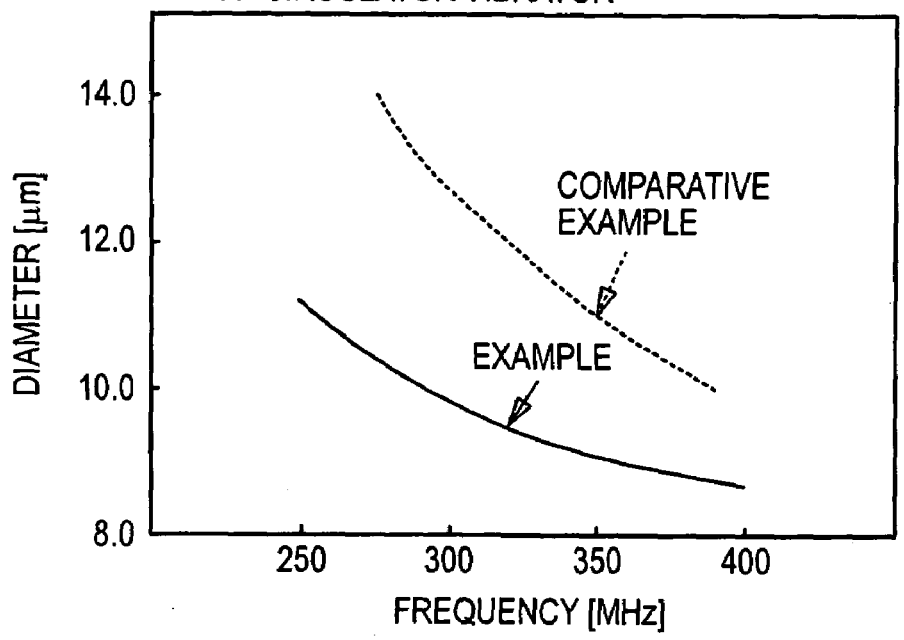
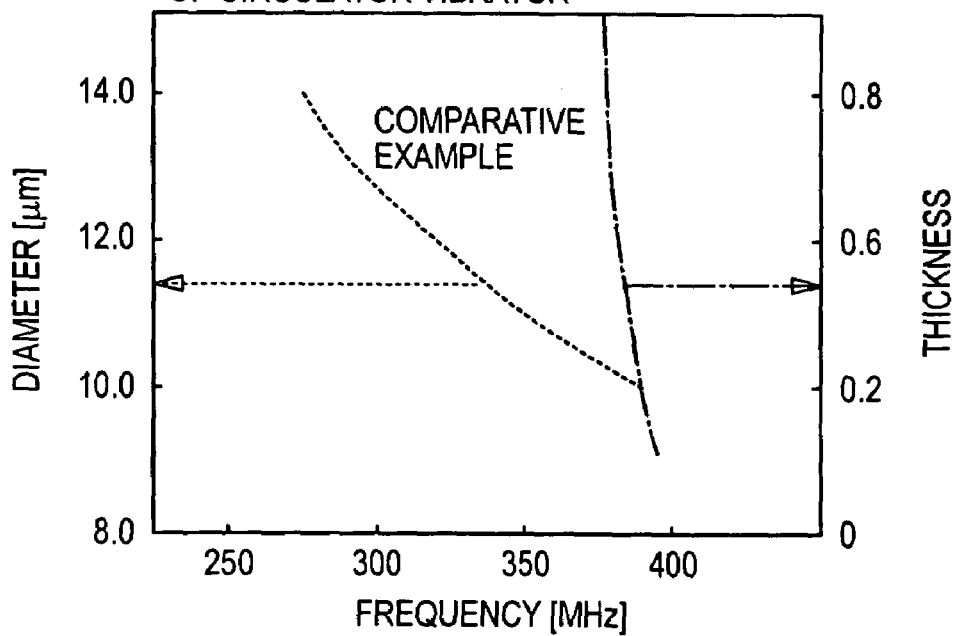

MICROMECHANICAL ELECTROSTATIC RESONATOR

BACKGROUND OF THE INVENTION

1. Field of Invention

Exemplary embodiments of the present invention relate to a micromechanical electrostatic resonator, and more specifically, relate to a structure of a micromechanical electrostatic resonator suitable for a high frequency resonator having a vibration body which is formed on a substrate using a Micro Electro Mechanical Systems (MEMS) technique.

2. Description of Related Art

The advent of a worldwide highly developed information society facilitates the progress of communication and multimedia markets. For example, a cellular phone for personal use is spread or a new business using an internet medium comes into existence. Among them, the cellular phone which is called as a motive power for the information age has many functions other than a simple function as a telephone. For example, the cellular phone is evolving so as to transmit and receive at high-speed large-scale data such as high quality music or color moving pictures, in addition to voices, characters and pictures. In order to mount such previously non-existent functions, on the cellular phone or the like, 'miniaturization and low weight' of electronic components is required due to space limitations. Further, a tendency to miniaturize a case of the cellular phone begins to appear a restriction due to operation limitation, and thus it is considered that a demand for 'thinning' increases in future. Meanwhile, lately, a demand in a market for 'high frequency' according to large scale information begins to appear drastically. For example, a wireless LAN is fully spread, a Bluetooth product appears, and a public use of UWB (Ultra Wide Band) is approved in United States of America. In addition, a communication apparatus is used in various fields such as a vehicle sensor, a notebook personal computer and so on. In order to maintain high properties under such various environments, it is required for 'high reliability' which does not exist up to now.

As a way to attain various demands as described above, a MEMS (Micro Electro Mechanical Systems) technology is exemplified. The MEMS, that is, the micro electro mechanical system is a high value-added component which is created with 'micromachining' based on fine processing techniques of a semiconductor. Along with a circuit, a fine structure, a sensor, an actuator or an energy source can be integrated in a small size. Demands for wireless apparatuses such as the cellular phone, the wireless LAN, a wireless function mounted sensor increase, and thus studies of RF (Radio Frequency) MEMS in this field are expanded. The RF MEMS attracts attention as a technique which realizes the miniaturization of the RF circuit. That is, passive components of the RF circuit such as an antenna switchable switch, a RF filter or a resonator are fabricated using the RF MEMS techniques, and thus it is expected that a communication apparatus is led overall to be miniaturized and to have high performance.

A high frequency resonator which uses a related art RF MEMS technique includes a micromechanical electrostatic resonator in which the mechanical vibration of a vibration body is excited by an electrostatic force based on alternating-current (AC) power, and a change in capacitance due to the mechanical vibration of the vibration body is used. The related art includes, as the micromechanical electrostatic resonator, a comb teeth-shaped resonator in which electrodes having a comb teeth structure are arranged oppositely to be engaged with each other. See, for example, WILLLAM C. TANG, et al. "Laterally Driven Resonant Microstructures" Sensors and Actuators, 20 (1989) P. 25–32. In this resonator, since the electrode portion has a comb teeth structure, a surface area is wide and a relatively low drive voltage is used. Further, since displacement and a change in capacitor are linear, it is advantageous in that a linear response is obtained.

Further the related art includes, as ones which are currently suggested, a resonator in which electrodes are provided at left and right sides or upper and lower sides of a beam portion, and the AC power is supplied to the electrodes such that the vibration body, of which both ends are supported by the beam portion, vibrates. See, for example, W. -T. Hsu, et al. "Q-optimized lateral free-free beam micromechanical resonators," Digest of Technical Papers, the 11th Int. Conf. on Solid-State Sensors and Actuators (Transducers'01), Munich, Germany, Jun. 10–14, 2001, pp. 1110–1113.

In addition the related art includes, a resonator in which a pair of electrodes are arranged oppositely to each other at both sides of an outer circumferential portion of a disk of which a center portion is supported and the AC power is supplied to the electrodes such that the disk vibrates in a high-order stretching mode. See, for example, J. R. Clark, et al. "High-Q VHF micromechanical contour-mode disk resonators," Technical Digest, IEEE Int. Electron Devices Meeting, San Francisco, Calif., Dec. 11–13, 2000, pp. 399–402.

Among various micromechanical electrostatic resonators described above, in the micromechanical electrostatic resonator comprising a comb teeth electrode structure of which both ends are supported by the beam portion and other movable portions, vibration is caused by the bending of the beam portion. Thus, it is referred to as a bending mode (bending vibration) resonator. Further, in the micromechanical electrostatic resonator in which a pair of electrodes are arranged oppositely to each other at both sides of the disk, the stretching vibration of the disk is used. Thus, it is referred to as a stretching mode (stretching vibration) resonator.

SUMMARY OF THE INVENTION

By the way, in the bending mode micromechanical electrostatic resonator, it is possible to enlarge displacement at the time of vibration, and it is possible obtain a large output voltage with a relatively low drive voltage. However, since a realizable vibration frequency is normally low in a range of about tens kHz to hundreds kHz, in particular, several MHz at most, there is a problem in that higher frequency of the vibration body is difficult.

Further, in the micromechanical electrostatic resonator including the above-mentioned related art comb teeth-shaped structure, by adapting the comb teeth-shaped structure, the capacitance between a drive electrode and a movable electrode becomes large. Further, by adapting the comb teeth-shaped structure, the planar projection areas of the drive electrode and the movable electrode become large, and thus the capacitance between the electrodes and the substrate increases.

In addition, a capacitance exists between wiring portions or connection terminals (bonding pad) conductively connected to the electrodes and the substrate. This is not confined to the resonator including the comb teeth-shaped structure. Since it is difficult to make a fine structure due to increase of resistance of a wiring line or conductive connection, the capacitance becomes relatively large as the electrode structure of the micromechanical electrostatic resonator is finely constructed.

Each of the capacitances is a normal component which does not depend on the movable electrode, but a change component of the capacitance due to a planar slide action of the movable electrode is considerably smaller than the normal component of the capacitance. That is, the change component of the capacitance which changes by the movable electrode, contributes to an output action of the electrostatic resonator, but a ratio of the change component of the capacitance is small. Therefore, in order to obtain an effective output signal from the electrostatic resonator, the drive voltage should be raised. Thus, it is difficult to design low voltage and low power consumption. This is a serious hindrance to practical use and commercialization of product.

Meanwhile, in order to design high frequency, the stretching mode electrostatic resonator is most preferable, and the above-mentioned disk-shaped resonator is effective to construct a high frequency resonator. However, since the stretching mode resonator has small displacement (amplitude) at the time of vibration, the output signal becomes also small. If vibration displacement is enlarged, it is needed to increase the electrostatic force. Thus, it is needed to raise an input voltage which is supplied to the electrodes. That is, similarly, it is difficult to raise the ratio of the output voltage to the input voltage. Therefore, there is a problem in that it is difficult to design low voltage and low power consumption.

Further, in this resonator, in order to design high frequency, it is needed to enlarge the thickness of the disk-shaped vibration body, or to reduce the radius of the disk shape. In order to enlarge the thickness of the vibration body, a long process time at the time of manufacture is required, and thus there is a restriction to increase the thickness of the vibration body. Further, if the disk shape becomes small, it is very difficult to detect the change amount of the capacitance. Thus, it is difficult to take out the output. Further, the drive voltage is enlarged.

Exemplary embodiments of the present invention address and/or solve the above discussed and/or other problems. Exemplary embodiments provide a method or a structure which can design higher frequency easily as compared with the related art in a micomechanical electrostatic resonator. Further, exemplary embodiments provide a micromechanical electrostatic resonator which can increase a ratio of an output voltage to an input voltage and design low drive voltage or low power consumption.

A micromechanical electrostatic resonator of exemplary embodiments of the present invention includes a plate-shaped vibration body, a pair of excitation electrodes arranged oppositely to each other at both sides of the vibration body with a gap from an outer circumferential portion of the vibration body, a feeding device to apply in-phase alternating-current power to the pair of excitation electrodes, and a detecting device for obtaining an output corresponding to a change in capacitance between the vibration body and the excitation electrodes, in which the planar shape of the vibration body takes a shape having a curved outline which includes neck portions.

As a result of earnest examination, it is confirmed that it is possible to obtain high frequency by making the planar shape of the plate-shaped vibration body in a shape having the curved outline which includes the neck portions, as compared with a case in which a related art vibration body having a circular planar shape is used. Thus, it is possible to design high frequency, without increasing the thickness of the vibration body or reducing the radius of the vibration body. As a result, it is possible to realize easily a high frequency resonator, without increasing manufacturing time and reducing detection level.

In exemplary embodiments of the present invention, the outline of the planar shape of the vibration body preferably includes circular arc portions and the neck portions, both ends of each of the neck portions being smoothly connected between the circular arc portions. According to this construction, since an angled portion is not present in the outline of the vibration body, while realizing higher frequency as described above, it is possible to obtain stable natural vibration and to reduce the loss of the vibration energy. In this case, the circular arc portion does not necessarily need to be exactly a circular arc. If the circular arc portion is constructed in an arc shape as a whole, it may be an elliptical arc or it may be an arc of which a curvature is gradually changed. However, the planar shape of the vibration body is preferably a symmetrical shape to the pair of electrodes (for example, line symmetry of which a symmetrical axis is a vertical bisector line of a line segment connecting the center portions of the pair of electrodes).

In exemplary embodiments of the present invention, the vibration body is preferably supported by a supporting portion formed on a substrate and is constructed in a shape which is stretched in the vicinity of the supporting portion. According to this construction, by making the vibration body being supported by the supporting portion and in a shape which is stretched in the vicinity of the supporting portion, it is possible to reduce the influence by the supporting portion in a stretching vibration, and it is possible to realize easily high frequency according to the planar shape of the vibration body. Here, the substrate is preferably made of an insulator. Thus, it is possible to avoid the influence by the parasitic capacitance between the resonator structure and the substrate.

In exemplary embodiments of the present invention, the vibration body is preferably made of a silicon layer or a silicon compound layer (a film to be used in an IC process: for example, Poly-Si, SiN or the like) constructed on a silicon substrate serving as the substrate. According to this construction, by constructing the vibration body made of the silicon layer on the silicon substrate, it is possible to form easily the resonator by a related art silicon semiconductor manufacturing process.

Next, another micromechanical electrostatic resonator of exemplary embodiments of the present invention includes a vibration body supported by a supporting portion and an excitation electrode arranged oppositely to an outer edge of the vibration body, in which a signal corresponding to vibration displacement of the vibration body is outputted, and the vibration body vibrates in a stretching mode by an electrostatic force which is generated between the vibration body and the excitation electrode, and in which the vibration body has a shape whose thickness increases from the supporting portion toward the outer edge.

According to exemplary embodiments of this invention, since the vibration body has the shape whose thickness increases from the supporting portion toward the outer edge opposing the excitation electrode, it is possible to increase the opposing area of the outer edge and the excitation electrode, and it is possible to enlarge the electrostatic force acting on the vibration body. Further, since the weight distribution of the vibration body is inclined toward the outer edge, it is possible to enlarge substantial elasticity of the vibration body. Therefore, it is possible to enlarge displacement of the stretching vibration of the vibration body. Further, since the opposing area of the outer edge and the excitation electrode increases, it is possible to enlarge the capacitance itself between the vibration body and the excitation electrode. For this reason, since the change in capacitance according to the vibration is enlarged, it is possible to enlarge an output voltage. In such a manner, in exemplary embodiments of the present invention, the displacement of the vibration body increases and the capacitance itself between the vibration body and the excitation electrode increases. Thus, it is possible to raise a ratio of an output voltage to an input voltage. Besides, since the vibration body vibrates in the stretching mode, it is easy to realize higher frequency.

Moreover, in the above-mentioned embodiment, the thickness of the vibration body means a thickness calculated in a direction which is orthogonal to a vibration surface including a vibration direction of the stretching vibration. Further, the shape whose thickness increases from the supporting portion toward the outer edge is not limited to the shape whose thickness gradually increases from the supporting portion toward the outer edge. The shape may include a shape whose thickness rapidly increase in a step shape on the way from the supporting portion toward the outer edge, and a shape in which an average thickness in a predetermined radius position of the outer edge side is larger than an average thickness in a predetermined radius position of the supporting portion side, as viewed from the radius direction.

In exemplary embodiments of the present invention, preferably, the vibration body has a stepped surface toward an opposite side to the outer edge, and the micromechanical electrostatic resonator further includes a second excitation electrode opposing the stepped surface. According to this construction, since the stepped surface toward the opposite side to the outer edge opposing the excitation electrode and the second excitation electrode opposing to the stepped surface are provided, an electrostatic force can be generated between the second excitation electrode and the vibration body. Thus, if the direction of the electrostatic force to be applied to the vibration body by the excitation electrode and the direction of the electrostatic force to be applied to the vibration body by the second excitation electrode are opposite to each other, it is possible to further enlarge the electrostatic force acting on the vibration body. Therefore, it is possible to further increase the displacement of the stretching vibration.

Here, the excitation electrode and the second excitation electrode are preferably driven so as to constantly have opposite polarities. If doing so, when an electrostatic repulsive force acts between the excitation electrode and the vibration body, an electrostatic attractive force acts between the second excitation electrode and the vibration body. Further, when an electrostatic attractive force acts between the excitation electrode and the vibration body, an electrostatic repulsive force acts between the second excitation electrode and the vibration body. In such a manner, it is possible to enlarge the electrostatic force acting on the vibration body to a maximum.

In exemplary embodiments of the present invention, the vibration body is preferably a plate-shaped body of which a center portion is supported. According to this construction, it is possible to allow the vibration body to vibrate effectively in the stretching mode with the center portion as a fulcrum. Further, owing to the plate-shaped body, it is possible to further enlarge the displacement of the stretching vibration. Besides, by making the vibration body in the plate-shaped body, it becomes possible to easily manufacture the vibration body by a thin film forming process such as a semiconductor manufacturing process.

Moreover, in each of the above-mentioned inventions, the vibration body, the excitation electrode, the second excitation electrode, and others are preferably formed on a substrate. In particular, if the substrate is made of a semiconductor substrate, a semiconductor circuit can be constructed as a body with the resonator. Here, the substrate is preferably made of an insulator. Therefore, it is possible to avoid the influence by the parasitic capacitance between the resonator structure and the substrate.

Next, still another micromechanical electrostatic resonator of the present invention includes a vibration body, and an excitation electrode arranged closely to the vibration body, in which the vibration body includes a supporting portion of which one end is fixed, and a driven portion which is connected to another end of the supporting portion and has an area greater than the supporting portion, the driven portion has a shape to be changed as viewed from a rotation direction with the supporting portion as a center, the excitation electrode includes an electrode surface arranged oppositely to a surface toward a direction which has components of the rotation direction, of which the center is the supporting portion, among the driven portion, and the vibration body vibrates in a twisted mode based on an electrostatic force generated between the vibration body and the excitation electrode.

According to this exemplary embodiment, the driven portion has a shape which is changed as viewed from the rotation direction with the supporting portion as the center, and the electrode surface of the excitation electrode is arranged oppositely to the surface which has the components of the rotation direction with the supporting portion as the center among the driven portion. Thus, it is possible to give the displacement of the rotation direction with the supporting portion as the center to the vibration body by the electrostatic force which is generated between the vibration body and the excitation electrode. Therefore, it is possible to drive the vibration body to vibrate in the twisted mode. In the micromechanical electrostatic resonator, the driven portion has a shape whose area is greater than the supporting portion. For example, if the driven portion has a portion to be stretched outside the radius direction with the supporting portion as the center, it is possible to allow the vibration body efficiently so as to vibrate in the twisted mode. Further, since the displacement can be enlarged, it is possible to realize the resonator having higher frequency, and simultaneously, it is possible to increase the ratio of the output voltage to the input voltage.

Moreover, in the above-mentioned invention, the shape which is changed as viewed from the rotation direction with the supporting portion as the center means a shape other than a shape (rotation body shape) which occupies a rotation trace when an arbitrarily shaped object with no change in shape, rotates around the axis line of the supporting portion. Further, the driven portion which is stretched in the magnified range more than the supporting portion means that the driven portion has a portion arranged outside the radius direction farther than the supporting portion when the vibration body is deformed in a twisted mode with the supporting portion as a center. Therefore, the shape of the driven portion does not necessarily to be stretched in a flat plate shape. The shape of the driven portion may have a bar shape which is stretched only in a predetermined direction.

In exemplary embodiments of the present invention, preferably, the outer edge of the driven portion is noncircular, and the electrode surface of the excitation electrode is arranged oppositely to the outer edge of the driven portion.

According to this construction, since the outer edge of the driven portion is noncircular, it becomes possible to drive the driven portion in the rotation direction by the electrostatic force which is generated between the driven portion and the excitation electrode arranged oppositely to the outer edge of the driven portion. Further, since the excitation electrode is arranged oppositely to the outer edge of the driven portion, it is possible to give large rotation torque to the vibration body, and simultaneously, it becomes possible to enlarge the displacement.

In exemplary embodiments of the present invention, preferably, the driven portion includes an opening portion passing through in a direction orthogonal to the rotation direction with the supporting portion as the center, and the electrode surface of the excitation electrode is arranged oppositely to an outer edge of the opening portion. If doing so, since the excitation electrode is arranged inside an occupied planar range of the driven portion, it is possible to construct the compact resonator.

In exemplary embodiments of the present invention, the supporting portion is preferably connected to a center position of the driven portion. According to this embodiment, since deformation stress resulting from gravitation becomes difficult to act on the driven portion, it is possible to allow the driven portion to stably vibrate in the twisted mode with the supporting portion as a fulcrum. Further, since vibrations other than the twisted vibration is difficult to generate.

In exemplary embodiments of the present invention, a plurality of excitation electrodes are preferably arranged in the vicinity of the supporting portion. According to this construction, since electrostatic forces from a plurality of points in the vicinity of the supporting portion can be given to the vibration body, it is possible to generate the twisted vibration more efficiently.

Moreover, in each of the above-mentioned embodiments, the vibration body and the excitation electrode are preferably formed on a substrate. In particular, when the substrate is a semiconductor substrate, they can be constructed as a body with a semiconductor circuit. Further, the substrate is preferably made of an insulator. Thus, it is possible to avoid the influence by the parasitic capacitance between the resonator structure and the substrate.

Further, in each of the above-mentioned inventions, preferably, a wiring layer is provided to be conductively connected to the vibration body or the excitation electrode, and a distance from the wiring layer to the substrate is larger than a distance from the vibration body or the excitation electrode to the substrate. According to this embodiment, since the distance from the wiring layer to the substrate is larger than the distance from the vibration body or the excitation electrode to the substrate, it is possible to reduce the capacitance generated between the wiring layer and the substrate. Thus, normal components of the capacitance becomes small, and it is possible to raise a ratio of change components of the capacitance resulting from the vibration that much. As a result, it is possible to enhance or improve output characteristics of the electrostatic resonator, and it is possible to reduce a drive voltage.

Here, the wiring layer means ones constructing a conductive connection to supply a potential to the vibration body or the excitation electrode or for taking out a signal from the vibration body or the excitation electrode, for example, a wiring portion, a connection terminal (bonding pad), or the like, in exemplary embodiments to be described below. In the vibration body and the excitation electrode, the vibration body may be constructed movable such that the electrostatic force may be generated between the vibration body and the excitation electrode.

In exemplary embodiments of the present invention, the wiring layer is preferably formed on an insulating layer which includes a surface spaced from the substrate, farther than a surface on which the vibration body or the excitation electrode is to be formed. According to this construction, since the wiring layer is formed on the insulating layer, it is possible to provide easily and surely the wiring layer at a position spaced from the substrate farther than the vibration body or the excitation electrode.

In this case, preferably, the vibration body or the excitation electrode is constructed on a surface of the insulator formed on the substrate, and the insulating layer has a dielectric constant lower than the insulator. If doing so, it is possible to further reduce the capacitance between the wiring layer and the substrate, as compared with a case in which the insulating layer and the insulator has the same dielectric constant (in case that, for example, they are made as the same insulating layer) or a case in which the insulating layer has a dielectric constant higher than the insulator.

Further, the insulating layer is preferably a porous film. According to this construction, since the insulating layer is made of the porous film, it is possible to lower the dielectric constant of the insulating layer. Thus, it is possible to further reduce the capacitance between the wiring layer and the substrate.

Next, a further micromechanical electrostatic resonator of exemplary embodiments of the present invention includes a substrate and a plurality of electrodes arranged on the substrate, at least one of the plurality of electrodes being movable, in which the micromechanical electrostatic resonator further includes a wiring layer conductively connected to the electrodes, and in which, based on a step which is constructed by an insulating layer provided between the wiring layer and the substrate, a distance from the wiring layer to the substrate is constructed to be larger than a distance from the electrodes to the substrate. According to this construction, since the distance from the wiring layer to the substrate is larger than the distance from the electrodes to the substrate, it is possible to reduce the capacitance which is generated between the wiring layer and the substrate. Thus, the normal components of the capacitance becomes small, and it is possible to raise the ratio of the change components of the capacitance resulting from the vibration that much. As a result, it is possible to enhance or improve the output characteristics of the electrostatic resonator, and it is possible to reduce the drive voltage. Further, since the above-mentioned construction is implemented based on the step which is constructed by the insulating layer between the wiring layer and the substrate, it is possible to manufacture the micromechanical electrostatic resonator extremely easily. Moreover, the construction in which at least one of the plurality of electrodes is movable may include a construction in which one electrode is used as the vibration body and another electrode is used as the excitation electrode.

In the present embodiment, a space is preferably provided between the wiring layer and the substrate. According to this construction, since the space is provided between the wiring layer and the substrate, it is possible to further lower the substantial dielectric constant between the wiring layer and the substrate. Thus, it is possible to further reduce the capacitance between the wiring layer and the substrate.

In each of the above-mentioned embodiments, the substrate is preferably a silicon substrate. According to this construction, since a semiconductor integrated circuit or the like can be suitably formed on the silicon substrate, it is possible to construct a circuit structure such as the semiconductor integrated circuit and the electrostatic resonator as a body. In this case, as described above, a piezoelectric thin film, an electrode and a wiring layer are preferably formed on the silicon substrate with the insulating layers therebetween. Further, the substrate may include a semiconductor substrate on which an IC such as SiGe or GaAs can be created.

Further, between the substrate and the vibration body or the excitation electrode, an insulating layer is preferably formed. Thus, it is possible to reduce the parasitic capacitance between the resonator structure and the substrate as a whole.

Further, the vibration body or the excitation electrode is preferably made of polysilicon, amorphous silicon or the like. These materials can be easily formed by semiconductor manufacturing techniques.

Further, in each of the above-mentioned embodiments, the substrate is preferably made of an insulator. According to this construction, since the micromechanical electrostatic resonator is formed using the substrate made of the insulator, it is possible to reduce the parasitic capacitance between the resonator structure formed on the substrate and the substrate. As a result, since a current flowing through the parasitic capacitance is drastically reduced, it is possible to enhance and/or improve the performance of the resonator.

Further, since the substrate is made of glass, it is possible to reduce the material cost of the substrate, and further it is possible to utilize techniques, which are established in manufacturing a liquid crystal display element, at the time of fine processes to the glass substrate. Thus, it is possible to obtain the high-performance micromechanical electrostatic resonator while reducing the manufacturing cost.

In addition, a method of manufacturing a micromechanical electrostatic resonator of exemplary embodiments of the present invention, which includes a substrate, a vibration body provided on the substrate, and an excitation electrode arranged oppositely to the vibration body, includes forming a concave portion on a surface of at least one of a first substrate made of an insulator and a second substrate having an active layer on its surface, joining the first substrate and the second substrate such that a surface of the first substrate and a surface of the second substrate face each other, and performing a predetermined process on the second surface, with which at least a part of the active layer remains, to form the vibration body and the excitation electrode on the first substrate.

According to this embodiment, the first substrate and the second substrate are joined such that a surface of the first substrate and a surface of the second substrate face each other, and a predetermined process on the second surface, with which at least a part of the active layer remains, is performed to form the vibration body and the excitation electrode on the first substrate. Thus, since the gap may be provided between the vibration body and the substrate by the concave portion, it is possible to manufacture the micromechanical electrostatic resonator at low cost and with high productivity. Further, since the resultant micromechanical electrostatic resonator includes the resonator structure on the substrate made of the insulator, it is possible to reduce the parasitic capacitance between the resonator structure and the substrate. Therefore, it is possible to manufacture the high-performance micromechanical electrostatic resonator.

In this case, the concave portion forming may include etching the active layer of the second substrate by a predetermined amount in a position at which the resonator structure is to be formed. Further, etching the surface of the first substrate by a predetermined amount facing the position of the second substrate at which the resonator structure is to be formed, may be included.

Further, since the substrate is made of glass, it is possible to reduce the material cost of the substrate, and further it is possible to utilize techniques, which are established in manufacturing a liquid crystal display element, at the time of fine processes to the glass substrate. Thus, it is possible to obtain the high-performance micromechanical electrostatic resonator while reducing the manufacturing cost.

In exemplary embodiments of the present invention, the resonator forming preferably includes thinning the second substrate joined to the first substrate with a predetermined thickness, and etching the thinned second substrate in a predetermined shape in a state in which at least a part of the active layer remains. According to this construction, after the first substrate and the second substrate are joined, the second substrate is thinned up to the predetermined thickness, and the thinned second substrate is etched in the predetermined shape. Thus, it is possible to form the resonator structure made of a semiconductor (active layer) on the substrate made of the insulator at low cost and with high efficiency, using existing process techniques.

In the present embodiment, preferably, the second substrate includes a silicon substrate, an insulating film formed on the silicon substrate, and the active layer formed on the insulating film, and the thinning is removing the silicon substrate by performing a polishing treatment or an etching treatment on the silicon substrate included in the second substrate. According to this construction, at least one of the polishing treatment and the etching treatment is performed on the silicon substrate which is provided on the second substrate, which is joined to the first substrate, to thereby remove the silicon substrate. Thus, it is possible to precisely form the active layer and the insulating film each having the predetermined thickness on the first substrate.

Moreover, the active layer may be made of any materials with which the vibration body or the excitation electrode of the micromechanical electrostatic resonator can be constructed, that is, which generates the electrostatic force when power is supplied.

BRIEF DESCRIPTION OF THE DRAWINGS

FIG. 9 is a graph showing a comparison of an example with a comparative example regarding a relationship of a diameter and a frequency of a disk-shaped resonator;

FIG. 10 is a graph showing a relationship of a diameter, a thickness and a frequency in a comparative example of a disk-shaped resonator;

DETAILED DESCRIPTION OF PREFERRED EMBODIMENTS

[First Exemplary Embodiment]

Figure 1A:
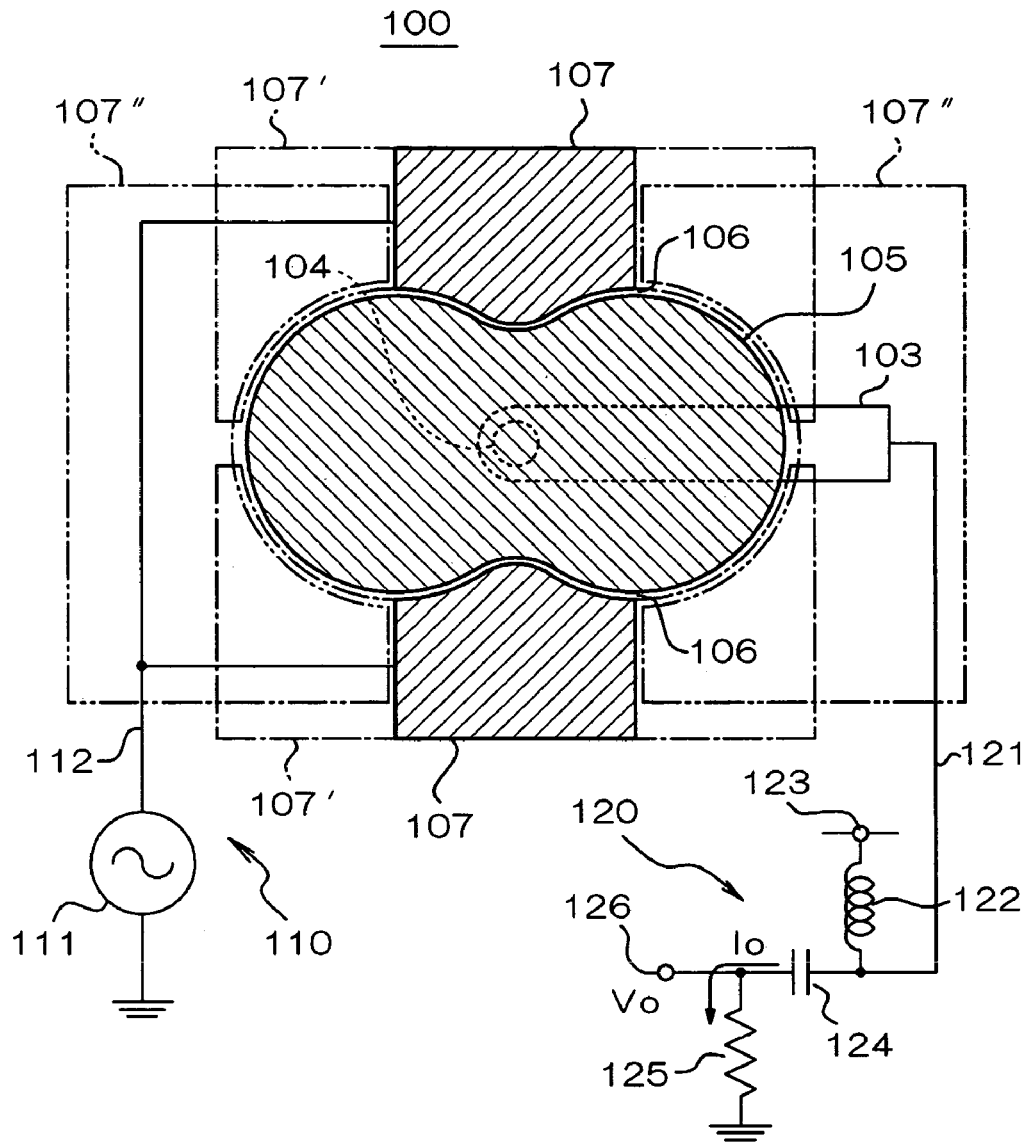
FIGS. 1(A) and 1(B) are schematic plan view and longitudinal cross-sectional views of a construction of a first exemplary embodiment.
Figure 1B:
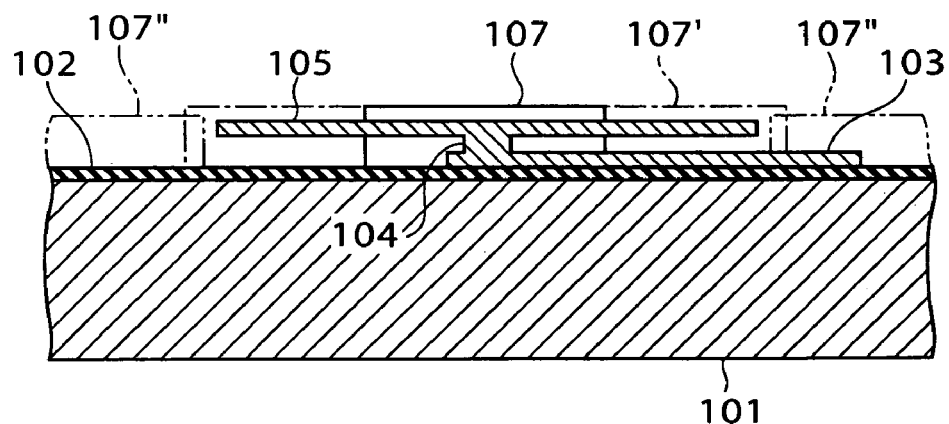

Next, a first exemplary embodiment of the present invention will be described with reference to the attached drawings. FIG. 1 shows a structure of a micromechanical electrostatic resonator 100 according to the first exemplary embodiment of the present invention, together with a circuit construction, and FIG. 1(A) is a schematic plan view and FIG. 1(B) is a schematic longitudinal cross-sectional view.

In the micromechanical electrostatic resonator 100, as occasions arise, an insulating film 102 to isolate a resonator structure is formed on a surface of a substrate 101 made of a silicon substrate or the like. On the substrate 101 or the insulating film 102, an output electrode 103, a supporting portion 104 and a vibration body 105 are constructed. Further, at both sides of the vibration body 105 (in the example shown in the drawing, upper and lower sides in FIG. 1(A) or front and back sides in FIG. 1(B)), a pair of excitation electrodes 107 and 107 are arranged oppositely to an outer circumferential portion of the vibration body 105 with a gap 106 therebetween.

Further, in the micromechanical electrostatic resonator 100, a feeding circuit 110 which constitutes a feeding device to apply in-phase alternating-current (AC) power to the pair of excitation electrodes 107 and 107 is provided. In the feeding circuit 110, an AC power source 111 and a feeding line 112 to connect the AC power source 111 and the excitation electrode 107 are provided. The feeding circuit 110 is preferably constructed in a monolithic type inside the substrate 101. However, the feeding circuit 110 may be constructed separately from the substrate 101 or may be constructed by only a wiring structure for supplying AC power from an external source.

In addition, in the present exemplary embodiment, an output circuit 120 which constitutes a detecting device to output an output signal according to a stretching vibration of the vibration body 105, together with the output electrode 103, is provided. In the output circuit 120, an inductance 122 is connected between a power source potential 123 and an output potential of an output line 121 of the output electrode 103, and a load resistance 125 is connected between the output potential and a ground potential. Further, a capacitance 124, of which a front end is connected to an output terminal 126, is provided between the output electrode 103, the load resistance 125 and the output terminal 126.

In the present exemplary embodiment, the vibration body 105 generates vibration in which the planar shape of the vibration body 105 is stretched in a plane between the pair of excitation electrodes 107 and 107, and the gap 106 is changed according to the stretching vibration. Thus, the capacitance between the vibration body 105 and the excitation electrode 107 increases or decreases. Since the increase or decrease of the capacitance appears as an output current Io which generates at the output circuit 120, an output potential Vo according to the output current Io and the load resistance 125 is outputted to the output terminal 126. The output potential Vo has vibration waveforms corresponding to a natural vibration frequency of the vibration body 105.

The stretching vibration of the vibration body 105 is a vibration of a diameter direction which follows a change in shape of an outline (outer circumferential portion) of the planar shape of the plate-shaped vibration body 105, and results from the electrostatic force between the vibration body 105 and the excitation electrodes 107 and 107. In the vibration mode, the vibration body 105 has the natural vibration frequency which is determined by the planar shape, the thickness and the density or the elastic characteristic of the constituent material (for example, Young's modulus or Poisson's ratio).

The vibration body 105 is supported by the supporting portion 104 formed on the substrate 101 and further it is constructed in a shape which is stretched in the vicinity of the supporting portion 104. Thus, it is constructed such that, in the stretching vibration, the influence of the supporting portion 104 is reduced, and high frequency is realized easily according to the planar shape of the vibration body.

Figure 2A:
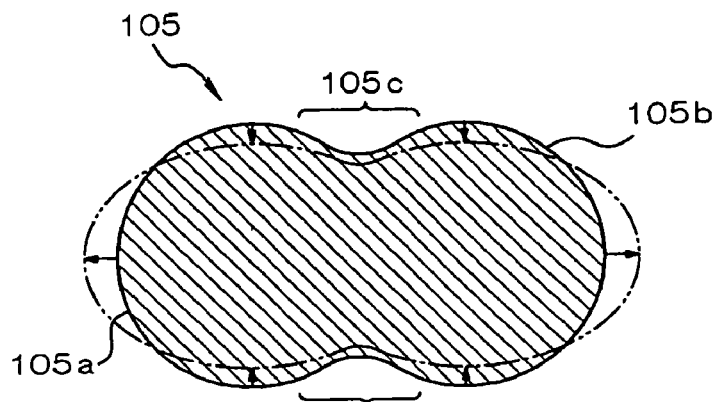
FIGS. 2(A) and 2(B) are schematics showing a vibration mode of the first exemplary embodiment.

The planar shape of the vibration body 105 includes a curved outline shape which includes neck portions, as shown in the drawings. More specifically, as shown in FIG. 2(A), the outline of the vibration body 105 includes a plurality of circular arc portions 105a and 105b (in the example, two circular arc portions are shown) in a circular arc shape and a plurality of neck portions 105c and 105d (in the example, two neck portion are shown), both ends of each of the neck portions being smoothly connected between the circular arc portions. In the example shown in the drawings, the circular arc portions 105a and 105b are symmetric, and the neck portions 105c and 105d are symmetric.

The excitation electrodes 107 and 107 indicated by solid lines in FIGS. 1A and B are arranged oppositely to the neck portions 105c and 105d of the vibration body 105, respectively. However, the electrode structure may be constructed by excitation electrodes 107' and 107' which are arranged oppositely to the circular arc portions 105a and 105b disposed at both sides with the neck portions 105c and 105d as a center, respectively, as shown in dash-dot lines in FIGS. 1A–B. Further, the electrode structure may be constructed by excitation electrodes 107" and 107" which are arranged oppositely to a center portion of the circular arc portions 105a and 105b, as shown in dash-dot-dot lines in FIGS. 1A–B.

Figure 2B:
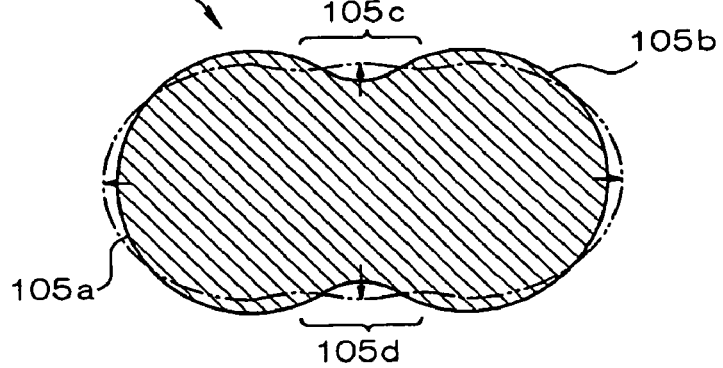
Figure 2C:
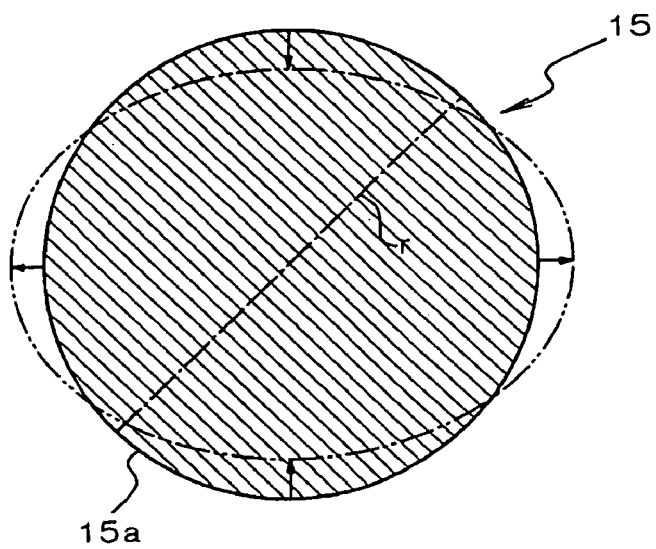
FIG. 2(C) is a schematic showing a vibration mode of a disk-shaped vibration body according to a related art.

Here, as shown in a dash-dot-dot line in FIG. 2(A), in the stretching mode in which the width between the circular arc portions 105a and 105b and the width between the neck portions 105c and 105d are reversely stretched, the example based on the present exemplary embodiment is compared with a comparative example in which a disk-shaped resonator shown in FIG. 2(C) is used. Here, in the comparative example, the disk-shaped resonator having a diameter r which is equal to the width between the circular arc portions 105a and 105b in the present exemplary embodiment is used. The thickness t of the vibration body and the electrode structure connected to the feeding device are the same as those of the present exemplary embodiment. By the way, in the example or the comparative example, the thickness t of the vibration body is 1 μm, the diameter r is 10 μm, and the constituent material of the vibration body is polysilicon. Further, in both the example and the comparative example, a circular supporting portion having a diameter of 1 μm is provided at the center portion of the resonator. And then, an analysis of a natural value is conducted. As the material constants of the vibration body for this calculation, Young's modulus is 160 GPa, Poisson's ratio is 0.3, and the density is 2500 kg/m$^3$. As a result, while the natural vibration frequency in the comparative example is about 385 MHz, the natural vibration frequency in the present exemplary embodiment is about 441 MHz. Further, as shown in FIG. 2(B), in the vibration body 105 of the present exemplary embodiment, the natural vibration frequency in the vibration mode in which the width between the circular arc portions 105a and 105b and the width between the neck portions 105c and 105d are stretched in phase is about 983 MHz. Thus, it is confirmed that the micromechanical electrostatic resonator of the present exemplary embodiment can design higher frequency as compared with the comparative example of the related art structure.

[Second Exemplary Embodiment]

Figure 3A:
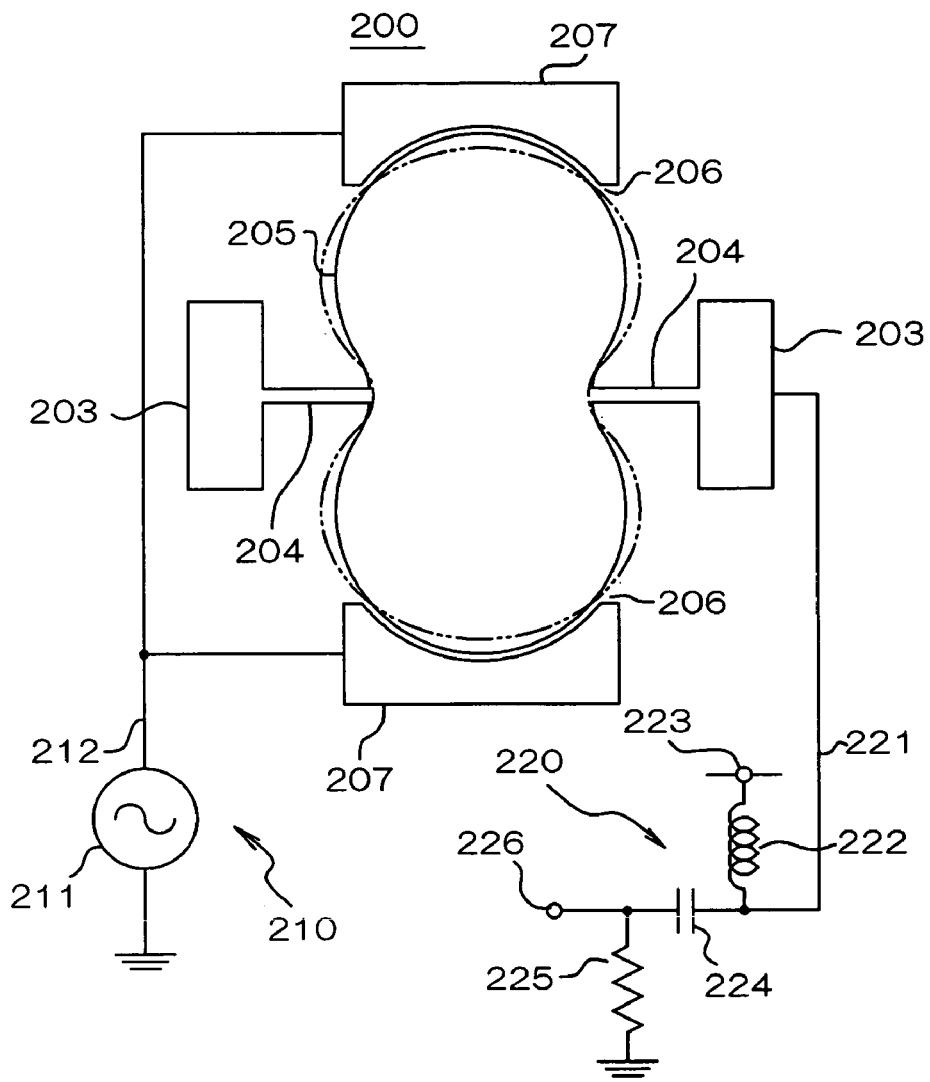
FIGS. 3(A) and 3(B) are a schematic plan view and a longitudinal cross-sectional view of a construction of a second exemplary embodiment.
Figure 3B:
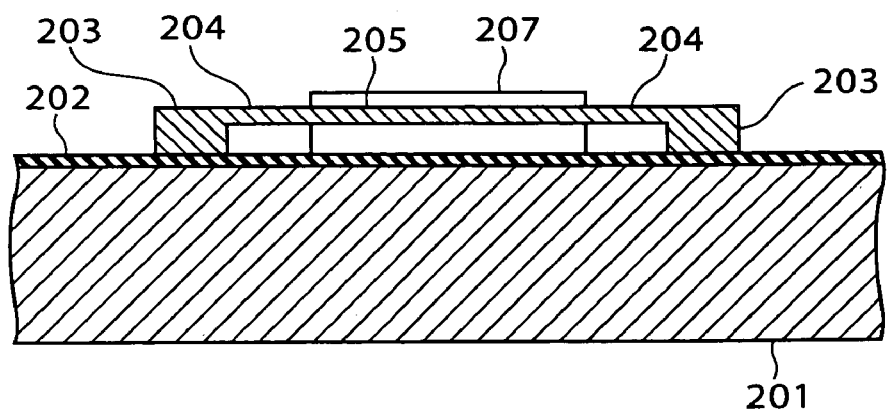

Next, the micromechanical electrostatic resonator 200 according to a second exemplary embodiment of the present invention will be described with reference to FIGS. 3A–B. The resonator 200 has the vibration body 205 having the approximately same planar shape as that of the vibration body in the first exemplary embodiment. However, the vibration body 205 in the second exemplary embodiment is different from the vibration body 105 in the first exemplary embodiment in that a center portion of a pair of neck portions is connected to the beam-shaped supporting portion 204. The supporting portion 204 supports the vibration body 205 from both sides in a beam shape and is constructed to be stretched approximately horizontally (that is, in parallel to the surface of the substrate 201). Further, another end of the supporting portion 204 is connected to the output electrode 203.

Further, in the present exemplary embodiment, a pair of excitation electrodes 207 and 207 is arranged oppositely to the center portion of the circular arc portions of the vibration body 205. And then, in-plane AC power is supplied to the excitation electrodes 207 and 207 by the AC power source 211 and the feeding line 212 of the feeding circuit 210. Further, the output circuit 220 is connected to the output electrode 203. Like the first exemplary embodiment, in the output circuit 220, the output line 221, the inductance 222, the power source potential 223, the capacitance 224, the load resistance 225 and the output terminal 226 are provided.

Like the first exemplary embodiment, in this exemplary embodiment, it is also possible to design higher frequency of the vibration body 205. Further, since the vibration body 205 and the supporting portion 204 can be constructed in the same layer and to have the same height, there leaves a margin for the film-forming process as compared with the first exemplary embodiment, and it becomes possible to form the vibration body quickly with high reproducibility.

[Other Exemplary Embodiments]

Figure 4A:
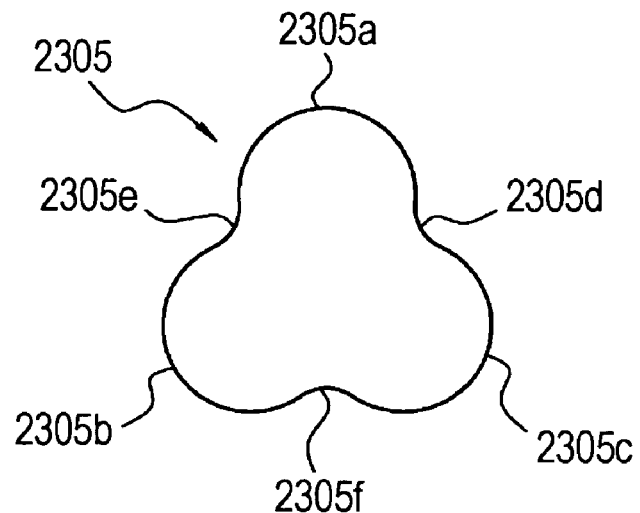
FIGS. 4(A) and 4(B) are schematic plan views showing examples of planar shapes of other vibration bodies.
Figure 4B:
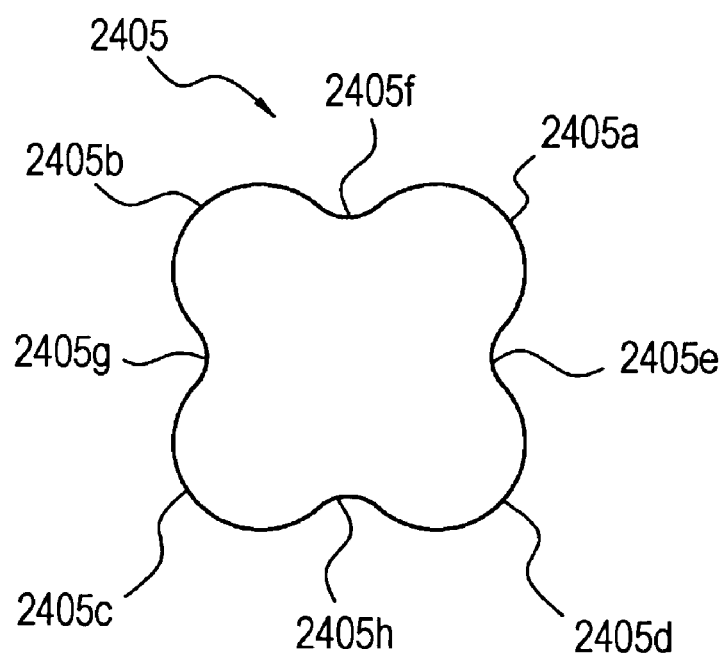

FIGS. 4A–B are plan views of the vibration bodies having other planar shapes which is capable of being used instead of the above-mentioned vibration bodies. The planar shape of the vibration body 2305 shown in FIG. 4(A) has an outline in which three circular arc portions 2305a, 2305b and 2305c are provided around its center and neck portions 2305d, 2305e and 2305f are respectively connected between the circular arc portions. Further, the planar shape of the vibration body 2405 shown in FIG. 4(B) has an outline in which four circular arc portions 2405a, 2405b, 2405c and 2405d are provided and neck portions 2405e, 2405f, 2405g and 2405h are respectively connected between the circular arc portions.

[Manufacturing Method]

Figure 5A:
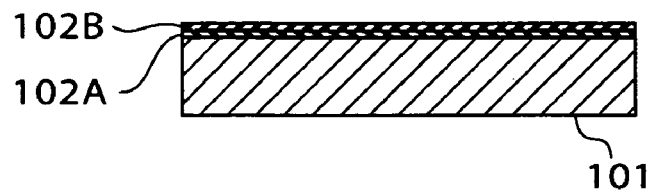
FIGS. 5(A) to 5(F) are schematic cross-sectional views showing a manufacturing process of the first exemplary embodiment.

FIGS. 5A–F and 6A–D are schematic cross-sectional views showing an example of a manufacturing process of the micromechanical electrostatic resonator 100 of the above-mentioned first exemplary embodiment. In this process, first, as shown in FIG. 5(A), the insulating layer 102A made of $SiO_2$ and the insulating layer 102B made of $Si_3N_4$ is formed on the substrate 101 made of the silicon substrate or the like. The insulating layer 102A may be formed with a thermal oxidization method or the like and the insulating layer 102B may be formed with a plasma CVD method or the like. The insulating layer 102A and the insulating layer 102B constitute the above-mentioned insulating film 102.

Figure 5B:
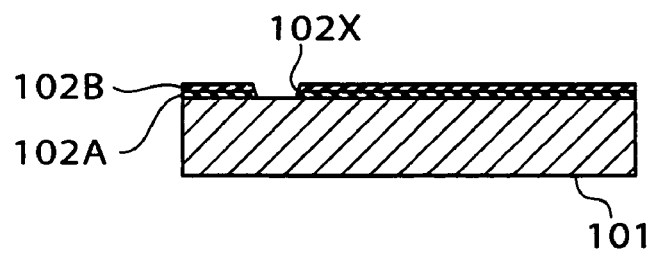
Figure 5C:
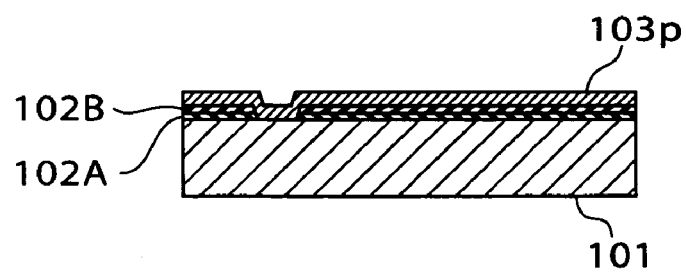
Figure 5D:
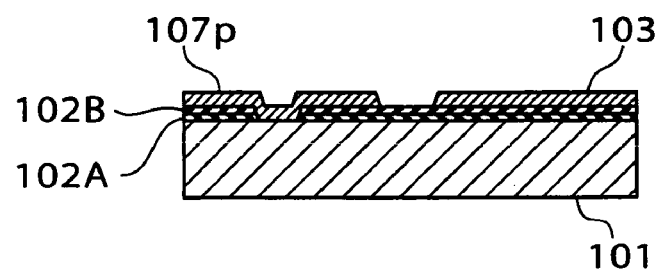

Next, as shown in FIG. 5(B), an opening 102x is formed in the insulating layer 102A and the insulating layer 102B using a photolithography method or the like, and, as shown in FIG. 5(C), a conductive layer 103p made of a metallic material such as aluminum is formed thereon using a vapor deposition method, a sputtering method or the like. And then, by patterning the conductive layer 103p with the photolithography method or the like, the output electrode 103 and the input electrode 107p are formed, as shown in FIG. 5(D).

Figure 5E:
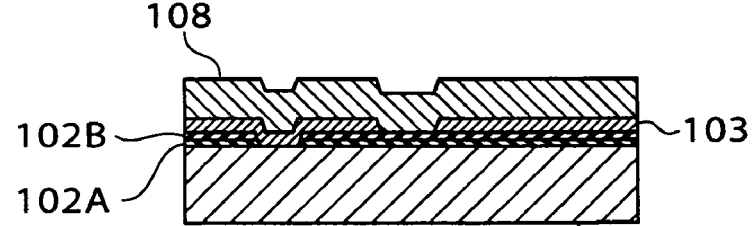
Figure 5F:
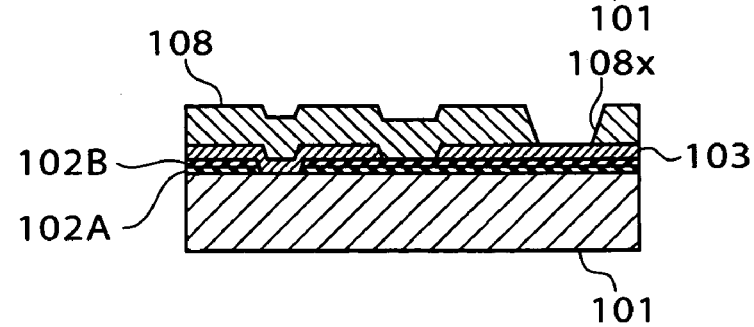
Figure 6A:
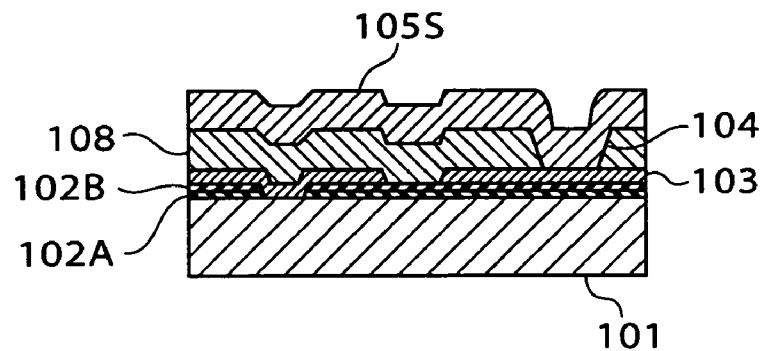
FIGS. 6(A) to 6(D) are schematic cross-sectional views showing the manufacturing process of the first exemplary embodiment.
Figure 6B:
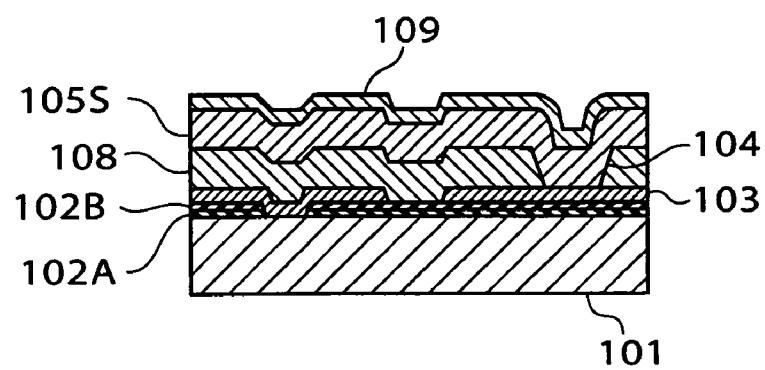
Figure 6C:
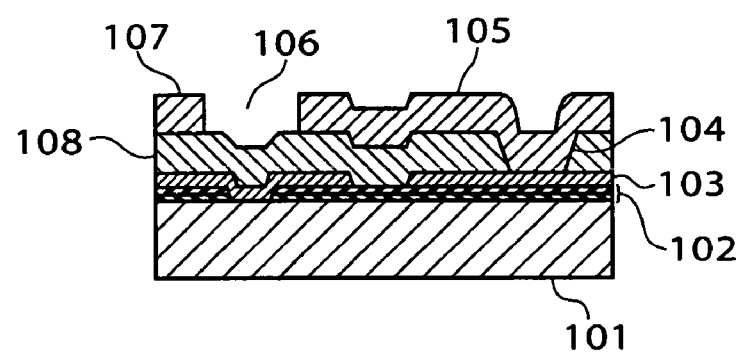

Subsequently, as shown in FIG. 5(E), a sacrificing layer 108 made of PSG (phosphorus doped glass) film is formed with the CVD method or the like, and further, as shown in FIG. 5(F), an opening 108x is formed. Subsequently, as shown in FIG. 6(A), a conductive layer 105S is film-formed with polysilicon or the like. In this situation, the supporting portion 104 is simultaneously formed inside the opening 108x. In addition, as shown in FIG. 6(B), a mask 109 is formed with resist or the like, and the conductive layer 105S is patterned through the mask 109. As a result, as shown in FIG. 6(C), the vibration body 105, the gap 106 and the electrode 107 are formed.

Figure 6D:
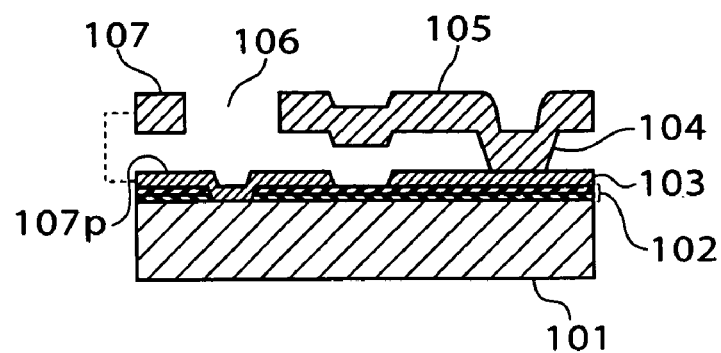

Finally, as shown in FIG. 6D), the sacrificing layer 108 is removed with etching or the like, such that the resonator structure shown in FIG. 1 is completed. Here, the excitation electrode 107 is in a state to be supported on a supporting layer (made of the above-mentioned sacrificing layer or the like) which is not shown. Further, the excitation electrode 107 is conductively connected to the input electrode 107p on the substrate via a contact hole (not shown) or the like.

As described above, in exemplary embodiments of the present invention, since the neck portions are provided in the outline of the planar shape of the vibration body, it is possible to realize high frequency. Further, since the control of the stretching vibration mode (vibration mode when the outline is changed) the vibration body becomes easy by means of the neck portions, it becomes possible to generate the stretching vibration more stably. For example, by providing the neck portions, a plurality of natural vibration frequencies can be obtained. Thus, it is possible to use one vibration body at different vibration frequencies according to the electrode structure, the applied frequency or the like. Further, like the excitation electrodes 107 and 107" in the first exemplary embodiment, a plurality of groups of excitation electrodes, in which the excitation electrodes in each group are arranged oppositely to the vibration body from different directions, may be provided. In this case, it becomes possible to use appropriately a group of excitation electrodes according to a required frequency characteristic.

In the present exemplary embodiment, the vibration body preferably has the planar shape which is symmetric with respect to the pair of excitation electrodes to be arranged at both sides thereof, in that stable vibration can be generated.

Here, the shape which is symmetric with respect to the pair of excitation electrodes devices, for example, the shape of a line symmetry of which a symmetrical axis is a vertical bisector line of a line segment connecting the center portions of the pair of excitation electrodes. In this case, it may also be the shape of the line symmetry of which a symmetrical axis is the line segment connecting the center portions of the pair of electrodes. For example, by using the vibration bodies 105 and 205 in the first and second exemplary embodiments or the vibration body 405 shown in FIG. 4(b), high symmetry can be realized.

Moreover, the micromechanical electrostatic resonator of the present invention is not limited to the examples shown in the drawings, but it can be variously modified within a range without departing from the subject matter of the present invention. For example, the micromechanical electrostatic resonators in the above-mentioned exemplary embodiments are constructed to have separately the input circuit and the output circuit, but various constructions, such as a construction in which the input circuit and the output circuit are realized with a common circuit structure, can be adapted.

[Third Exemplary Embodiment]

Figure 7A:
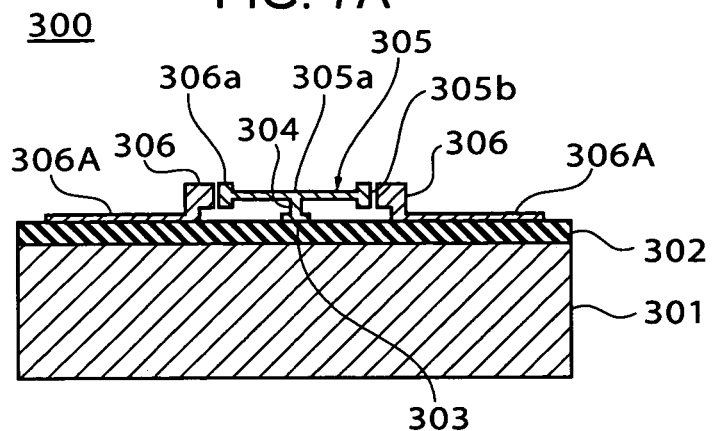
FIGS. 7(A) and 7(B) are a schematic longitudinal cross-sectional view and a schematic plan view of a third exemplary embodiment.
Figure 7B:
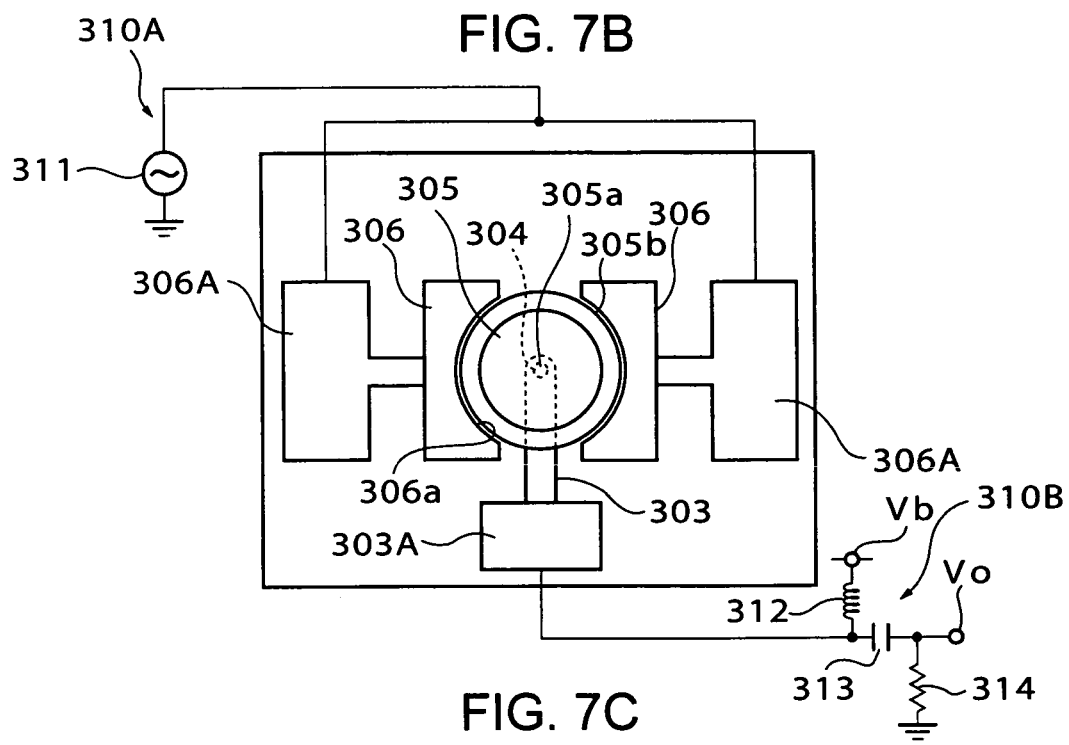
Figure 7C:
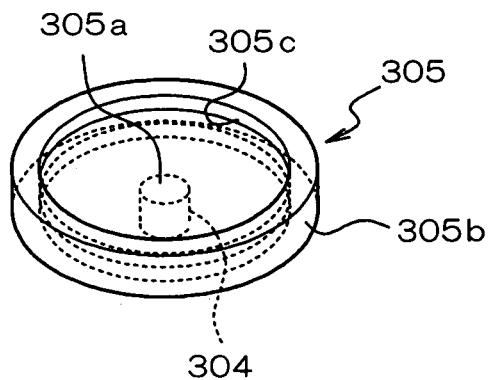
FIG. 7(C) is a schematic expanded perspective view of a vibration body.

FIGS. 7A–C show a structure of the micromechanical electrostatic resonator 300 according to a third exemplary embodiment of the present invention. FIG. 7(A) is a schematic longitudinal cross-sectional view, FIG. 7(B) is a schematic plan view and FIG. 7(C) is a schematic expanded perspective view showing the shape of the vibration body 305. In the electrostatic resonator 300, the insulating layer 302 is formed on the substrate 301 and the resonator structure is formed on the insulating layer 302. The substrate 301 is preferably the semiconductor substrate such as silicon single crystal or compound semiconductor such as GaAs or InP, but it may be constructed with other materials such as glass, quartz, ceramics or synthetic resin. Further, the insulating layer 302 is not needed when the substrate 301 is made of the insulator. However, when the substrate 301 is made of semiconductor or conductor, or when the substrate 301 is made of the insulator with a conductive material such as a conductive pattern on its surface, the insulating layer 302 is needed.

The resonator structure includes the vibration body 305 in which a supported portion 305a is supported via a supporting body 304 arranged on a reference electrode 303 and excitation electrodes 306 opposing the outer edge 305b of the vibration body 305. The reference electrode 303, the supporting body 304 and the vibration body 305 are conductively connected to each other. These are made of a material having a certain degree of conductance, for example, polysilicon. The vibration body 305 is constructed in a plate-shaped body of which the center portion is the supported portion 305a supported by the supporting body 304. In the example shown in FIGS. 7A–C, the vibration body 305 is formed in a disk shape.

At both sides (left and right sides in FIGS. 7A–C) of the vibration body 305, the pair of excitation electrodes 306 and 306 are arranged. The excitation electrode 306 has an electrode surface 306a which is stretched along an outer edge 305b of the vibration body 305. In the example shown in FIGS. 7A–C, since the outer edge 305b of the vibration body 305 is a cylindrical convex surface stretched in an arc shape, the electrode surface 306a of the excitation electrode 306 has a surface shape corresponding to the surface shape of the outer edge 305b, that is, a cylindrical concave surface stretched in an arc shape. In such a manner, between the outer edge 305b of the vibration body 305 and the electrode surface 306a of the excitation electrode 306, a constant spacing exists covering overall opposing portion of them.

In the example shown in FIGS. 7A–C, a connection terminal (bonding pad) 303A is conductively connected to the reference electrode 303, and a connection terminal (bonding pad) 306A is conductively connected to the excitation electrode 306 respectively. However, instead of providing the connection terminals 303A and 306A in such a manner, the reference electrode 303 and the excitation electrode 306 may be conductively connected inside the circuit formed on the substrate 301.

In the present exemplary embodiment, as shown in FIG. 7(B), the input circuit 310A is conductively connected to the excitation electrode 306 and the output circuit 310B is conductively connected to the reference electrode 303. The input circuit 310A is to supply a drive voltage to the excitation electrode 306. In the present exemplary embodiment, for the input circuit 310A, for example, the AC power source 311 is provided. Further, the output circuit 310B is to output an output voltage based on a potential of the reference electrode 303. In the present exemplary embodiment, the output circuit 310B includes, for example, an inductance 312 connected between the reference electrode 303 and a bias potential Vb, a capacitance 313 connected between the reference electrode 303 and an output potential Vo, and a resistance 314 connected between the output potential Vo and a ground potential. The bias potential Vb is to apply a bias voltage to the reference electrode 303. Here, the output potential Vo represents a change in potential corresponding to a change in potential of the reference electrode 303, which is obtained by charging current or discharging current of the capacitance 313 and the resistance 314.

In the present exemplary embodiment, a high frequency filter is constructed such that an input signal to be supplied from a portion corresponding to the input circuit 310A is modulated by vibration characteristics of the vibration body 305 and the excitation electrode 306 to thereby obtain the output potential Vo. The filter characteristics depend on characteristics of the stretching vibration mode of the vibration body 305. More specifically, the electrostatic force is generated between the vibration body 305 and the excitation electrode 306 based on the input signal, and the vibration body 305 vibrates in the stretching mode by way of a change in the electrostatic force (alternation of direction). If the vibration body 305 vibrates, the distance from the vibration body 305 to the excitation electrode 306 changes, and thus the capacitance between them also changes. According to the change in capacitance, the output potential Vo also periodically changes.

The vibration body 305, as shown in FIG. 7(C), has a shape whose thickness increases from the supported portion 305a, which is supported by the supporting body 304, toward the outer edge 305b. Moreover, in the example shown in FIGS. 7A–C, a portion covering a predetermined range from the supported portion 305a toward an outside in the radius direction has the same thickness. Meanwhile, a stepped surface 305c is provided at the outside, and the thickness of the portion at the outside in the radius direction more than the stepped surface 305c is larger than that of the portion at an inside in the radius direction more than the stepped surface 305c. In the example shown in FIGS. 7A–C, the stepped surface 305c is formed on both the front surface side and the rear surface side of the vibration body 305. Further, the stepped surface 305c is made of a surface which is directed to an opposite side to the outer edge 305b, that is, a center side.

The vibration body 305 is deformed in the stretching mode by the excitation electrode 306 with main surface of a plate-shaped body (horizontal surface in FIGS. 7A–C) as a vibration surface, to thereby vibrate in the stretching mode. Here, the thickness of the vibration body 305 is a width in a direction orthogonal to the vibration surface. The vibration body 305 has a symmetric shape (that is, front and rear surfaces symmetry shape) in the thicknesswise direction. Thus, it is possible to make the vibration state on the vibration surface stable, and it is possible to suppress the generation of a secondary vibration mode which does not exist on the vibration surface. Therefore, it is possible to reduce or prevent useless dissipation of vibration energy.

If power is supplied to the excitation electrode 306, the electrostatic force is generated between the outer edge 305b of the vibration body 305 and the excitation electrode 306. In this situation, if a voltage to be applied to the excitation electrode 306 is an AC voltage (alternating voltage), the electrostatic repulsive force and the electrostatic attractive force are alternately exerted between the outer edge 305b of the vibration body 305 and the excitation electrode 306. Thus, the vibration body 305 repeats periodically expansion and contraction between the pair of the excitation electrodes 306, such that the vibration in the stretching mode is excited.

In this situation, if the frequency of the input voltage to be applied to the excitation electrode 306 accords to the natural frequency in the stretching mode of the vibration body 305, the vibration body 305 resonates, and then the output signal becomes large. Therefore, the electrostatic resonator 300 of the present exemplary embodiment can be used as a band pass filter or an oscillator. Here, when the diameter of the vibration body 305 is about 1 to 100 μm and the thickness thereof is about 0.1 to 10 μm, the natural frequency in the stretching vibration excited in the vibration body 305 becomes about 10 MHz to 1 GHz.

In the present exemplary embodiment, since the vibration body 305 has the shape whose thickness increase from the supported portion 305a toward the outer edge 305b, it is possible to increase an opposing area of the outer edge 305b and the excitation electrode 306. Thus, the electrostatic force acting on the vibration body 305 is enlarged. Further, since the weight distribution of the vibration body 305 is inclined toward the outer edge 305b, it is possible to raise substantial elasticity of stretching vibration of the vibration body 305. Therefore, it is possible to increase stretching displacement of the vibration body 305, and thus it is possible to raise the ratio of the output voltage to the input voltage as compared with the prior art.

The electrostatic resonator 300 of the present exemplary embodiment can be formed by forming a sacrificing layer made of $SiO_2$, PSG (phosphorus doped glass), organic resin or the like between the insulating layer 302 and the vibration body 305 or the excitation electrode 306, and by removing the sacrificing layer with etching or the like after forming the vibration body 305 and the excitation electrode 306. The vibration body 305 and the excitation electrode 306 may be made of a semiconductor, such as polysilicon, other than a metallic material, such as aluminum or copper. In any cases, the above-mentioned structure can be formed with the film-forming techniques, such as the vapor deposition method, the sputtering method or the CVD method, and the patterning techniques, such as the photolithography method.

[Fourth Exemplary Embodiment]

Figure 8A:
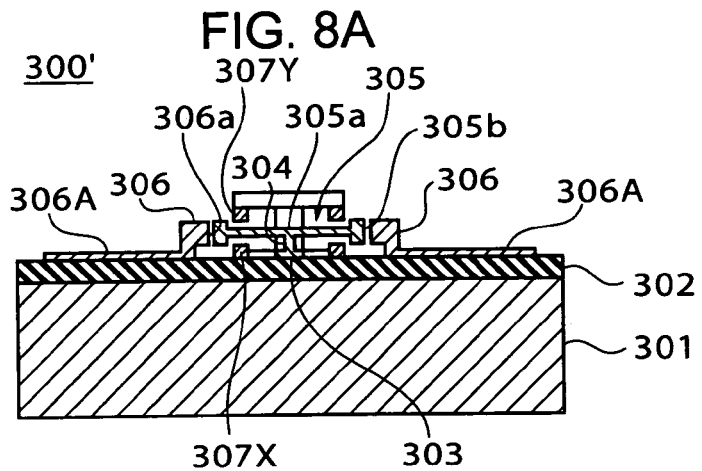
FIGS. 8(A) and 8(B) are a schematic longitudinal cross-sectional view and a schematic plan view of a fourth exemplary embodiment.
Figure 8B:
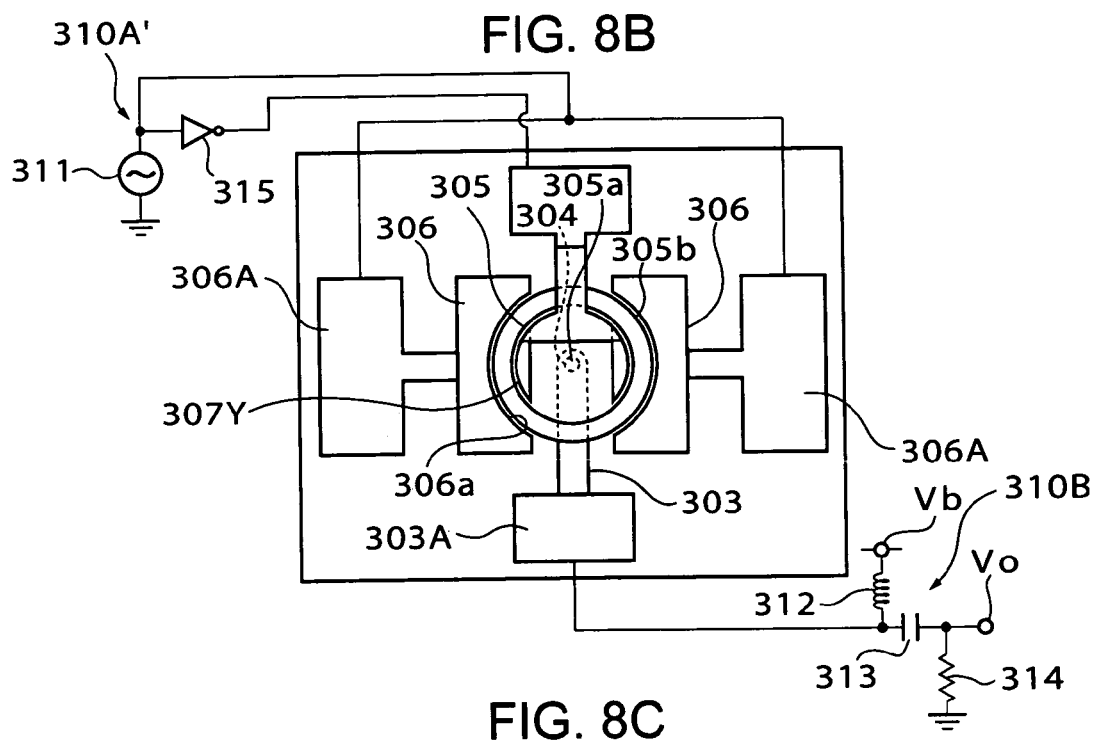
Figure 8C:
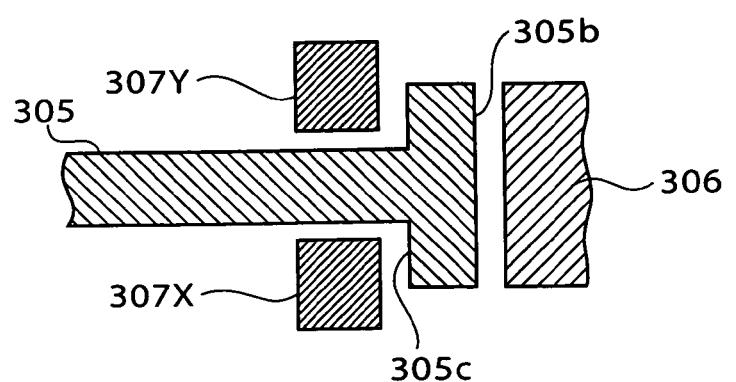
FIG. 8(C) is a schematic expanded perspective view of a periphery of an outer edge portion of a vibration body.

Next, an electrostatic resonator 300' according to a fourth exemplary embodiment of the present invention will be described with reference to FIGS. 8A–C. In this exemplary embodiment, the same reference numerals as those of the third exemplary embodiment represent the same elements, and the descriptions on the same elements will be omitted.

This exemplary embodiment includes specifically elements all of which are described in the third exemplary embodiment, but this exemplary embodiment is different from the third exemplary embodiment in that second excitation electrodes 307X and 307Y which are arranged oppositely to the stepped surface 305c of the vibration body 305 are further provided. Here, the second excitation electrode 307X is arranged oppositely to the stepped surface 305c which is provided on the rear surface (lower surface) of the vibration body 305, and it is directed toward the electrode surface 306a of the excitation electrode 306 which is disposed at the side of the stepped surface 305c. The second excitation electrode 307Y is arranged oppositely to the stepped surface 305c which is provided on the front surface (upper surface) of the vibration body 305, and it is directed toward the electrode surface 306a of the excitation electrode 306 which is disposed at the side of the stepped surface 305c. Here, any one of the second excitation electrodes 307X and 307Y may be provided.

The second excitation electrodes 307X and 307Y are conductively connected to a common connection terminal (bonding pad) 307A. As shown in FIG. 8(B), an AC voltage (alternating voltage) in the reverse phase to the excitation electrode 306 is applied to the second excitation electrodes 307X and 307Y from an inversion circuit 315 provided in an input circuit 310A'. Thus, as shown in FIG. 8(C), it is possible to construct such that, when the electrostatic repulsive force is generated between the outer edge 305b of the vibration body 305 and the excitation electrode 306, the electrostatic attractive force is generated between the stepped surface 305c of the vibration body 305 and the second excitation electrodes 307X and 307Y. Meanwhile, when the electrostatic attractive force is generated between the outer edge 305b of the vibration body 305 and the excitation electrodes 306, the electrostatic repulsive force is generated between the stepped surface 305c of the vibration body 305 and the second excitation electrodes 307X and 307Y. Therefore, since the electrostatic force for generating the stretching vibration of the vibration body 305 increases, it is possible to increase the stretching displacement of the vibration body 305. As a result, it is possible to raise the output voltage (amplitude of the output signal), and thus it is possible to further raise the ratio of the output voltage to the input voltage as compared with prior art.

In this exemplary embodiment, in order to construct the second excitation electrodes 307X and 307Y, sacrificing layers are respectively interposed between the second excitation electrode 307X and the vibration body 305 and between the vibration body 305 and the second excitation electrode 307Y. Finally, like the third exemplary embodiment, it is possible to manufacture the electrostatic resonator 300' by removing the sacrificing layers using etching or the like.

COMPARISON OF EXAMPLE AND COMPARATIVE EXAMPLE

Next, a comparison result of the example of the third exemplary embodiment and a comparative example in which a parallel plate-shaped vibration body having the same thickness covering from the supported portion 305a up to the outer edge 305b is used, instead of the vibration body 305 of the third exemplary embodiment, will be described. Moreover, in the example and the comparative example, the vibration bodies have the substantially same weight and average thickness. Therefore, the vibration body of the example has a shape in which a portion at a center side in the vibration body of the comparative example is removed by constant amount and the removed portion of the constant amount is added at an outer edge side.

The resonant frequency f of the disk-shaped resonator is represented by an expression of $f=(\alpha/R)(E/\rho)^{1/2}$. Here, $\alpha$ is a coefficient depending on Poisson's ratio of the vibration body and the vibration mode, R is a diameter of the vibration body, E is Young's modulus of the vibration body, and $\rho$ is a density of the vibration body. As being seen from this expression, the resonant frequency is in inverse proportional to the diameter R.

FIG. 9 is a graph showing a relationship of the diameter and the natural frequency of the vibration body in the example and the comparative example. Both the example and the comparative example reflect the above-mentioned expression, and the frequencies are in inverse proportional to the diameter. Further, in the example, the resonant frequency is rather lowered with respect to the comparative example, but it can be seen that, in the example, the vibration body vibrates at high frequency of hundreds MHz. Here, the material of the vibration body is Si, Young's modulus is 160 GPa, and the density is 2500 kg/m³.

FIG. 10 is a graph showing a relationship of a diameter and a thickness and a natural frequency in the vibration body of the comparative example. As being seen from FIG. 10, in the disk-shaped resonator, the natural frequency raises as the diameter becomes small, but even when the thickness changes, the natural frequency is almost never changed. Meanwhile, in the disk-shaped resonator, since the vibration body vibrates in the stretching mode, the stretching displacement becomes further small as the diameter becomes small, such that the ratio of the output voltage to the input voltage is further lowered. Therefore, by raising the stretching displacement using the structure of the example, even though the diameter of the vibration body is made to be small, it can be seen that the ratio of the output voltage to the input voltage can be enlarged.

Figure 11:
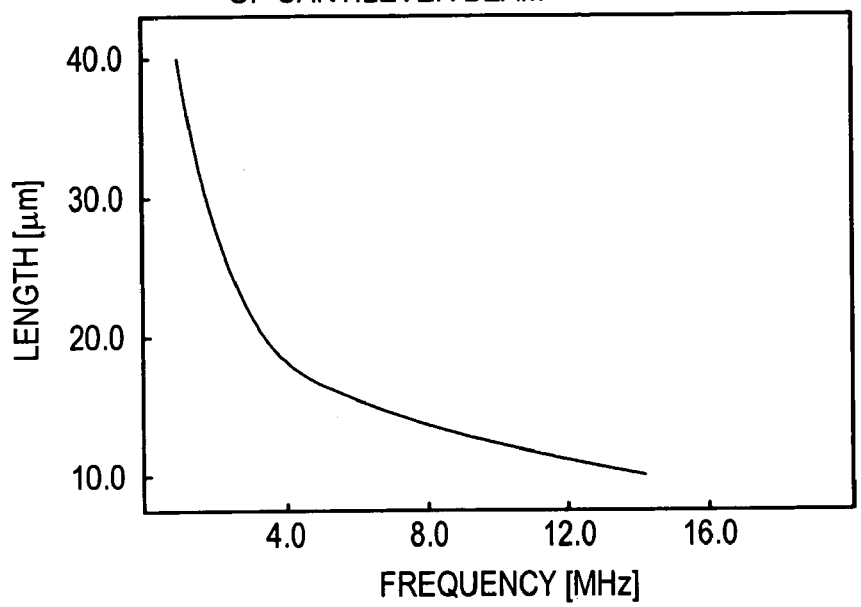
FIG. 11 is a graph showing a relationship of a length of a beam and a frequency in a bending vibration mode of a cantilever beam.

FIG. 11 is a graph showing a relationship of a length of an end from the supported portion and a natural frequency of a cantilever beam when a cantilever beam-shaped vibration body vibrates in a bending mode. In the vibration body in the bending mode, the large vibration displacement can be adopted, but, as shown in FIG. 11, the natural frequency is about several MHz, and thus it can be seen that the vibration body of the comparative example is not suitable for higher frequency.

Figure 16:
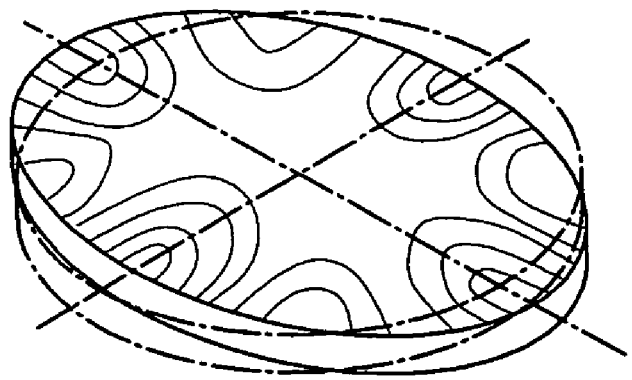
FIG. 16 is a schematic diagram showing displacement distributions in equivalent displacement lines at the time of the vibration of a vibration body in an example.
Figure 17:
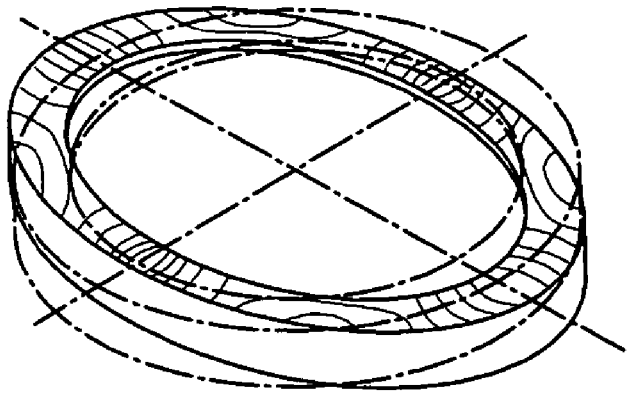
FIG. 17 is a schematic diagram showing displacement distributions in equivalent displacement lines at the time of the vibration of a vibration body in a comparative example.

Next, the displacements in the stretching vibration of the example and the comparative example are compared with each other. The result is shown in FIGS. 16 and 17. FIG. 16 is a schematic showing the displacement distribution of the example in equivalent displacement lines, and FIG. 17 is a schematic showing the displacement distribution of the comparative example in equivalent displacement lines. Here, the material of the vibration body is Si, Young's modulus is 170 GPa, and the density is 2500 kg/m³. The vibration bodies in the example and the comparative example have the same mass and are set to vibrate by the same load. In addition, the vibration bodies are set to vibrate in the same mode, and then the displacement distributions are calculated. As shown in FIGS. 16 and 17, the example of FIG. 17 exhibits large displacement as compared with the comparative example of FIG. 16. Further, as regards spring constants of the respective resonators in the example and the comparative example, 643 N/m and 1103 N/m are obtained respectively. The low spring constant in the example means that the frequency is lowered, but that the displacement (amplitude) becomes large when the same load is given. Here, if the same input voltage is applied to the respective resonators in the example and the comparative example, an area of the outer edge 305b in the example is larger than that in the comparative example, and thus stress (electrostatic force) acting on the resonator in the example becomes larger than that in the comparative example. In this case, it is considered that a difference of displacement becomes larger than those in the cases shown in FIGS. 16 and 17.

[Other Exemplary Embodiments]

Figure 12:
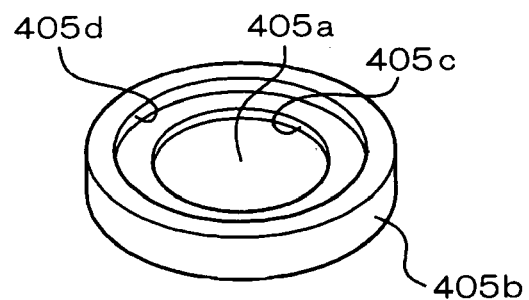
FIG. 12 is a schematic perspective view showing a shape of another vibration body.

FIG. 12 is a schematic perspective view showing a shape of a different vibration body 405 from those in the above-mentioned exemplary embodiments. The vibration body 405 can be used as a substitute for the vibration bodies of the third and fourth exemplary embodiments. The vibration body 405 includes stepped surfaces 405c and 405d provided at plural positions (in FIG. 12, two positions are shown) from the supported portion 405a at a center up to an outer edge 405b. If doing so, the weight distribution is further inclined toward the outer edge 405b. Thus, it is possible to further raise displacement at the time of the vibration.

Figure 13:
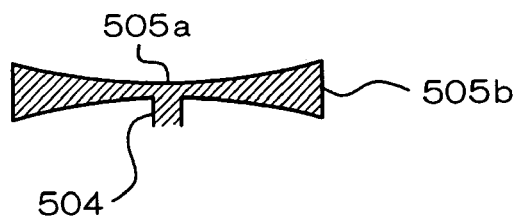
FIG. 13 is a schematic longitudinal cross-sectional view showing a shape of a further vibration body.

FIG. 13 is a schematic longitudinal cross-sectional view of a still another vibration body 505. The vibration body 505 can also be used as a substitute for the vibration bodies in the third and fourth exemplary embodiments. In the vibration body 505, its thickness becomes gradually large from a supported portion 505a at a center, which is supported by a supporting portion 504, up to the outer edge 505b. In this situation, similarly, the weight distribution is inclined toward the outer edge 505b, and it is possible to increase the area of the outer edge 505b. Thus, it is possible to further raise displacement at the time of the vibration.

Figure 14:
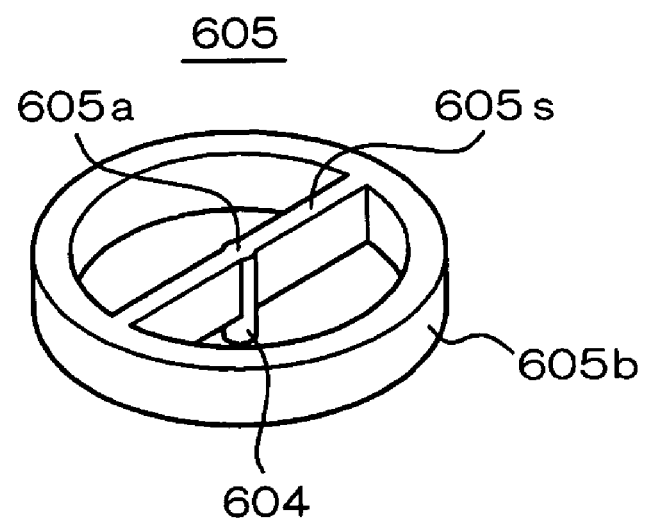
FIG. 14 is a schematic perspective view showing a shape of an additional vibration body.

FIG. 14 is a schematic perspective view of a further vibration body 605. The vibration body 605 can also be used as a substitute for the vibration bodies of the third and fourth exemplary embodiments. The vibration body 605 is different from the above-mentioned vibration bodies in that a supported portion 605a which is supported by a supporting portion 604 and an outer edge 605b are connected only by two beam portions 605s. In this case, an average value of the thickness at a predetermined radius position in the outer edge side becomes larger than an average value of the thickness at a predetermined radius position in the center side. The two beam portions 605s are stretched in an opposite side to each other from the supported portion 605a and are connected to the ring-shaped outer edge 605b.

Figure 15:
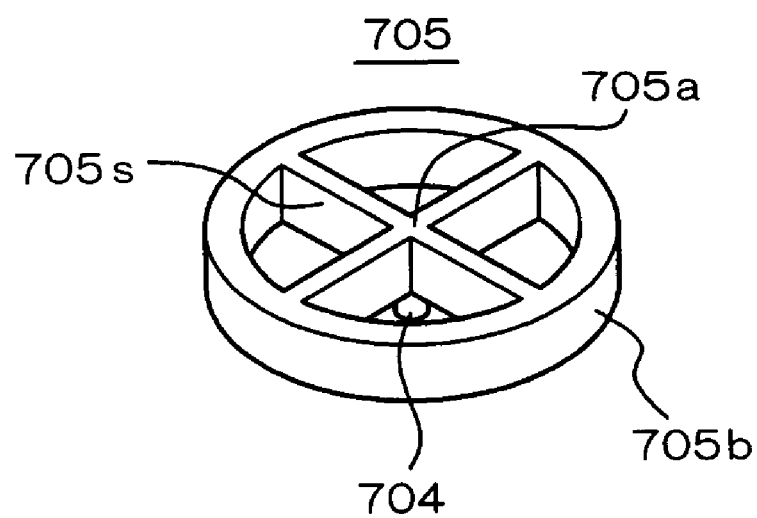
FIG. 15 is a schematic perspective view showing a shape of a further additional vibration body.

FIG. 15 is a schematic perspective view of a still further vibration body 705. The vibration body 705 can also be used as a substitute for the vibration bodies of the third and fourth exemplary embodiments. In the vibration body 705, a supported portion 705a which is supported by a supporting portion 704 and an outer edge 705b are connected by four beam portions 705s. In such a manner, the supported portion and the outer edge can be connected, regardless of the number of the beam portions. In this case, similarly, an average value of the thickness in a predetermined radius position in the outer edge side becomes larger than an average value of the thickness in a predetermined radius position in the center side.

Moreover, the micromechanical electrostatic resonator of exemplary embodiments of the present invention is not limited to the above-mentioned examples shown in the drawings, but it can be variously modified within a range without departing from the subject matter of embodiments of the present invention. For example, in the third and fourth exemplary embodiments, the planar shape of the vibration body is circular, but the present invention is not limited to such a planar shape. The planar shape of the vibration body may include various planar shapes, such as an elliptic shape, an oval shape or a rectangular shape, other than the circular shape. Further, in the third and fourth exemplary embodiments, the center of the vibration body is made as the supported portion, but, if the vibration body vibrates in the stretching mode, the supported portion may be disposed at an inclined position of the vibration body, not its center. For example, the vibration body may be supported in a cantilever manner.

[Fifth Exemplary Embodiment]

Figure 18A:
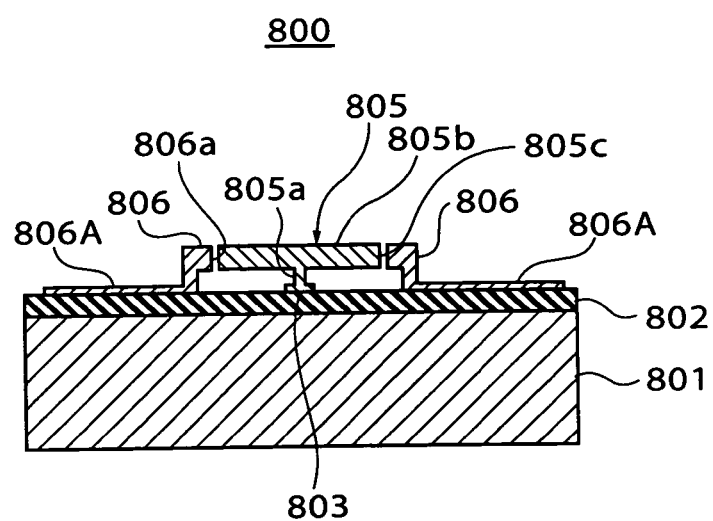
FIGS. 18(A) and 18(B) are a schematic longitudinal cross-sectional view and a schematic plan view of a fifth exemplary embodiment.
Figure 18B:
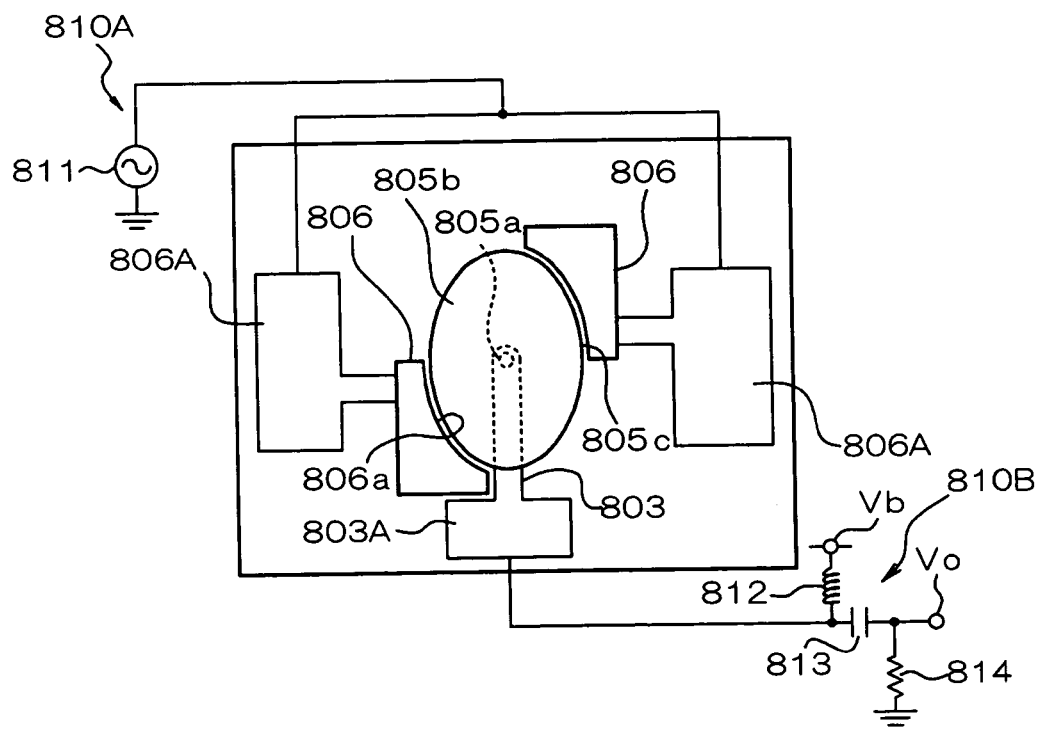

FIGS. 18A–B show a structure of a micromechanical electrostatic resonator 800 according to a fifth exemplary embodiment of the present invention. FIG. 18(A) is a schematic longitudinal cross-sectional view and FIG. 18(B) is a schematic plan view. In the micromechanical electrostatic resonator 800, an insulating layer 802 is formed on a substrate 801 and a resonator structure is formed on the insulating layer 802. The substrate 801 is preferably a semiconductor substrate made of silicon single crystal, compound semiconductor such as GaAs or InP, or the like, but it may be made of other materials such as glass, quartz, ceramics or synthetic resin. Further, the insulating layer 802 is not needed when the substrate 801 is made of an insulator. However, when the substrate 801 is made of semiconductor or conductor, or when the substrate 801 is made of the insulator with a conductive material such as a conductive pattern on its surface, the insulating layer 802 is needed.

The resonator structure includes a vibration body 805 connected to a reference electrode 803 and excitation electrodes 806 arranged closely to the vibration body 805. The reference electrode 803 and the vibration body 805 are conductively connected to each other. These are made of a material having a certain degree of conductance, for example, polysilicon. The vibration body 805 includes a supporting portion 805a of which a lower end is fixed to the reference electrode 803 and a driven portion 805b which is connected to a top portion of the supporting portion 805a. The driven portion 805b has a shape whose area is greater than the supporting portion 805a in plan view. More specifically, the driven portion 805b is made with a plate-shaped body having a center position (the center of gravity) to which the supporting portion 305a is connected. The driven portion 805b has a shape which is changed as viewed from a rotation direction with the supporting portion 805a as the center, that is, a shape other than a shape, such as a rotation body shape, occupying a rotation trace when an arbitrary object with no change in shape rotates. In the example in FIGS. 18A–B, the driven portion 805b is formed in an elliptic disk shape. In this exemplary embodiment, the driven portion 805b is being supported in a cantilever manner on the top portion of the cylindrical supporting portion 805a. Moreover, unlike the example shown in FIGS. 18A–B, the driven portion 805b may be supported by upper and lower supporting portions from both sides.

At both sides (left and right sides in FIGS. 18A–B) of the vibration body 805, a pair of excitation electrodes 806 and 806 are arranged. The excitation electrode 806 has an electrode surface 806a which is stretched along an outer edge 805c of the vibration body 805. In the example shown in FIGS. 18A–B, since the outer edge 805c of the vibration body 805 is an elliptic cylindrical convex surface stretched in an elliptic arc shape, the electrode surface 806a of the excitation electrode 806 has a surface shape corresponding to the surface shape of the outer edge 805*c*, that is, an elliptic cylindrical concave surface stretched in an elliptic arc shape. The electrode surface 806*a* of the excitation electrode 806 faces a surface portion toward a direction which has components of the rotation direction with an axis line of the supporting portion 805*a* as the center, among the outer edge 805*c* of the vibration body 805. That is, the excitation electrodes 806 are arranged oppositely to each other at an eccentric position with respect to the vibration body 805, that is, an eccentric position in the rotation direction from a long axis and a short axis.

In the example shown in FIGS. 18A–B, a connection terminal (bonding pad) 803A is conductively connected to the reference electrode 803, and a connection terminal (bonding pad) 806A is conductively connected to the excitation electrode 806 respectively. However, instead of providing the connection terminals 803A and 806A in such a manner, the reference electrode 803 and the excitation electrode 806 may be conductively connected inside the circuit formed on the substrate 801.

In the present exemplary embodiment, as shown in FIG. 18(B), an input circuit 810A is conductively connected to the excitation electrode 806 and an output circuit 810B is conductively connected to the reference electrode 803. The input circuit 810A is to supply a drive voltage to the excitation electrode 806. In the present exemplary embodiment, for the input circuit 810A, for example, an AC power source 811 is provided. Further, the output circuit 810B is to output an output voltage based on a potential of the reference electrode 803. In the present exemplary embodiment, the output circuit 810B includes, for example, an inductance 812 connected between the reference electrode 803 and a bias potential Vb, a capacitance 813 connected between the reference electrode 803 and an output potential Vo, and a resistance 814 connected between the output potential Vo and a ground potential. The bias potential Vb is to apply a bias voltage to the reference electrode 803. Here, the output potential Vo represents a change in potential corresponding to a change in potential of the reference electrode 803, which is obtained by charging current or discharging current of the capacitance 813 and the resistance 814.

In the present exemplary embodiment, a high frequency filter is constructed such that an input signal to be supplied from a portion corresponding to the input circuit 810A is modulated by vibration characteristics of the vibration body 805 and the excitation electrode 806 to thereby obtain the output potential Vo. The filter characteristics depend on characteristics of the twisted vibration mode of the vibration body 805. More specifically, the electrostatic force is generated between the vibration body 805 and the excitation electrode 806 based on the input signal, and the vibration body 805 vibrates in the twisted mode by way of a change in the electrostatic force (alternation of direction). If the vibration body 805 vibrates, the distance from the vibration body 805 to the excitation electrode 806 changes, and thus the capacitance between them also changes. According to the change in capacitance, the output potential Vo also periodically changes.

Figure 19A:
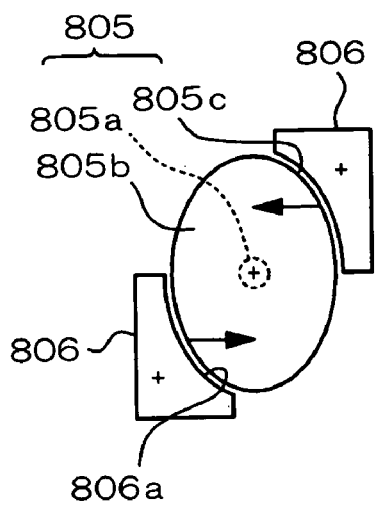
FIGS. 19(A) and (B) are schematic diagrams illustrating a drive aspect and a motion of a vibration body in the fifth exemplary embodiment.
Figure 19B:
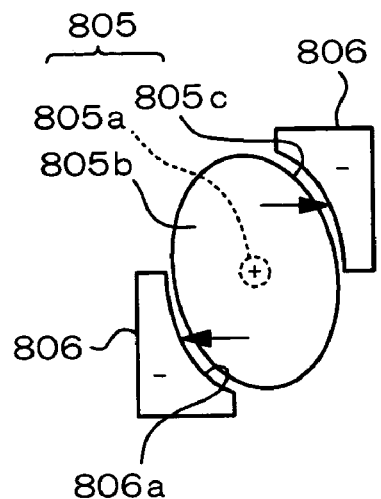

FIGS. 19(A) and 19(B) are diagrams illustrating vibration aspects of the vibration body 805. As shown in FIG. 19(A), when an electrostatic repulsive force is generated between the driven portion 805*b* and the excitation electrode 806, a rotation torque acts on the vibration body 805 to rotate in a counterclockwise direction in FIG. 19(A), and then twisted displacement is generated according to the elastic characteristic of the vibration body 805. Next, when an electrostatic attractive force is generated between the driven portion 805*b* and the excitation electrode 806, a rotation torque acts on the vibration body 805 to rotate in a clockwise direction in FIG. 19(B), and then twisted displacement is generated according to the elastic characteristic of the vibration body 805. Therefore, the electrostatic repulsive force and the electrostatic attractive force are alternately generated between the driven portion 805*b* and the excitation electrode 806, such that the vibration body 805 vibrates in the twisted mode.

Moreover, the method for generating the twisted vibration in the vibration body 805 is not limited to the method in which the electrostatic repulsive force and the electrostatic attractive force are alternately applied as described above, but it may include a method in which any one of the electrostatic repulsive force and the electrostatic attractive force is periodically applied. Further, in the exemplary embodiment, the pair of excitation electrodes 806 are provided with respect to the vibration body 805, but only one excitation electrode may be provided, or three or more excitation electrodes 806 may be provided.

When the vibration body 805 vibrates as described above, if the frequency of the input voltage which is to be applied to the excitation electrode 806, accords to the natural frequency in the twisted mode of the vibration body 805, the vibration body 805 resonates, and then the output signal becomes large. Therefore, the electrostatic resonator 800 of the present exemplary embodiment can be used as a band pass filter or an oscillator. Here, when the long diameter, the short diameter and the thickness of the top portion of the vibration body 805 are 10 μm, 5 μm and 2 μm, respectively, the diameter and the thickness of the supporting portion 805*a* thereof are 2 μm and 5 μm, respectively, and the constituent material of the vibration body 805 is polysilicon, the natural frequency in the twisted vibration of the vibration body 805 becomes about 15 to 20 MHz.

In the present exemplary embodiment, since the vibration body 805 uses the twisted vibration, it is possible to allow the vibration body 805 to vibrate at higher frequency than that in the bending vibration, and it is possible to obtain displacement larger than that in the stretching vibration (longitudinal vibration). Thus, it is possible to raise the ratio of the output voltage to the input voltage as compared with the related art, and it is possible to design a low input voltage (drive voltage). In particular, since the vibration body 805 includes the supporting portion 805*a* and the magnified driven portion 805*b* connected to the supporting portion 805*a*, rotation torque acting on the vibration body 805 becomes large due to the electrostatic force, and then it is possible to generate efficiently the twisted vibration. Further, since displacement of the twisted vibration becomes large, it is possible to enlarge the ratio of the output voltage to the input voltage.

In the present exemplary embodiment, since the supporting portion 805*a* is connected to a center position of the driven portion 805*b*, the driven portion 805*b* is stably supported by the supporting portion 805*a*. Thus, even when the electrostatic force from the excitation electrode 806 acts on the vibration body 805, vibrations other than the twisted direction are difficult to be generated. Thus, it is possible to vibrate in the twisted mode in a stable posture, and the loss of the vibration energy is little.

The electrostatic resonator 800 of the present exemplary embodiment can be formed easily by forming a sacrificing layer made of $SiO_2$, PSG (phosphorus doped glass), organic resin or the like between the insulating layer 802 and the vibration body 805 or the excitation electrode 806, and by removing the sacrificing layer using etching or the like after forming the vibration body 805 and the excitation electrode 806. The vibration body 805 and the excitation electrode 806 may be made of polysilicon, other than a metallic material such as aluminum or copper. In particular, when the vibration body 805 and the excitation electrode 806 are made of polysilicon, a silicon semiconductor process can be applied as it is. Besides, if the vibration body 805 and the excitation electrode 806 are formed on a silicon substrate, it is possible to manufacture them extremely easily. In any cases, the above-mentioned structure can be formed with the film-forming techniques, such as the vapor deposition method, the sputtering method or the CVD method, and the patterning techniques, such as the photolithography method.

[Sixth Exemplary Embodiment]

Figure 20:
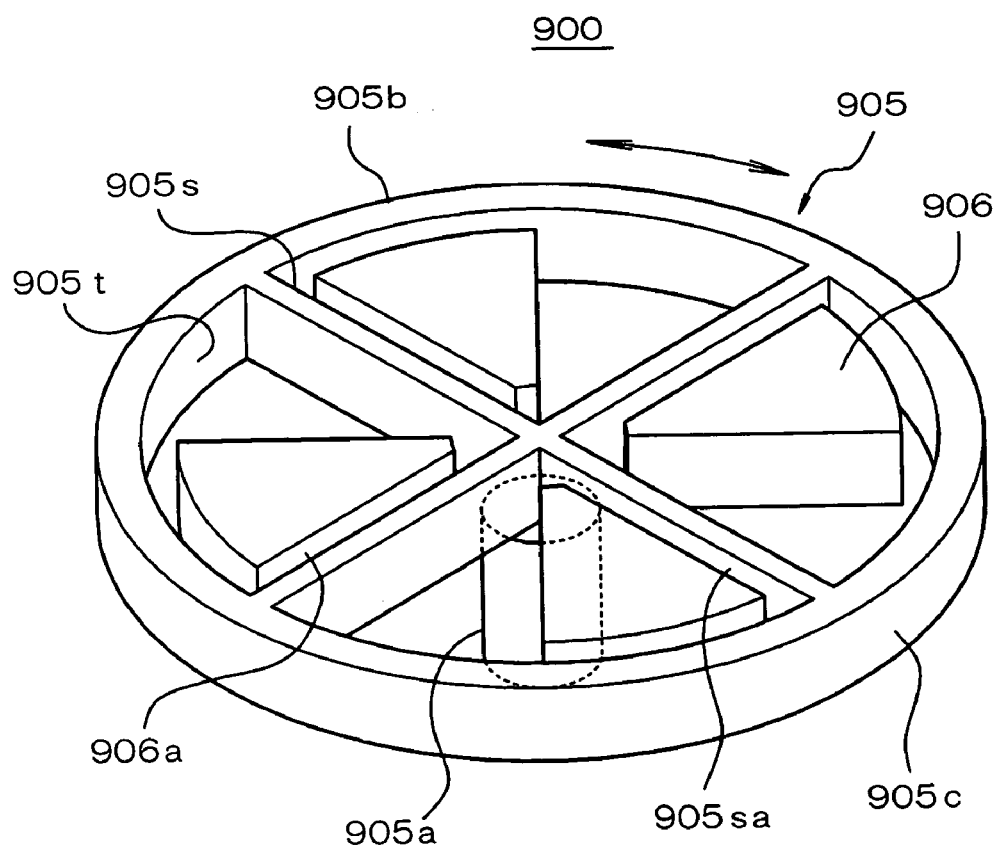
FIG. 20 is a schematic perspective view of a vibration body of a sixth exemplary embodiment.

Next, an electrostatic resonator 900 according to a sixth exemplary embodiment will be described with reference to FIG. 20. In this exemplary embodiment, elements other than a vibration body 905 and excitation electrodes 906 are made similarly to those of the fifth exemplary embodiment, and then the descriptions on the same elements will be omitted.

In this exemplary embodiment, the vibration body 905 includes a supporting portion 905a of which a lower end is fixed and a driven portion 905b which is connected to an upper end of the supporting portion 905a. The driven portion 905b includes a plurality of wheel-shaped portions 905s which are stretched in a radial shape from a connection portion with respect to the supporting portion 905a to a periphery, and a ring-shaped outer wheel portion 905c connected to top ends of the wheel-shaped portions 905s. In the example shown in FIG. 20, four wheel-shaped portions 905s are provided at an interval of 90 degrees. Between the wheel-shaped portions 905s, openings 905t passing through in a direction orthogonal to the vibration surface of the twisted vibration are provided.

Figure 21A:
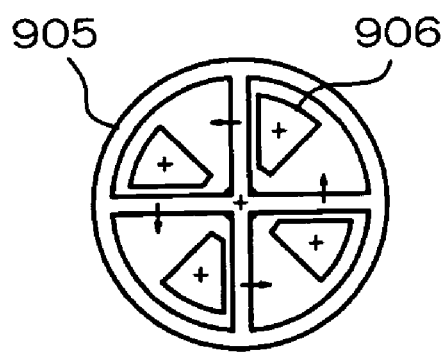
FIGS. 21(A) and 21(B) are schematic diagrams illustrating a drive aspect and a motion of a vibration body in the sixth exemplary embodiment.
Figure 21B:
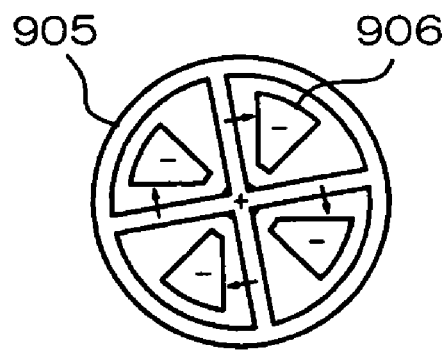

Meanwhile, the excitation electrodes 906 are arranged inside the openings 905t. In the example shown in FIG. 20, the excitation electrodes 906 are respectively arranged in the plurality of openings 905t. Each of the excitation electrodes 906 is arranged at an eccentric position in any one direction of the rotation direction around the axis line in the opening 905t in an initial state in which the electrostatic force is not applied and is arranged oppositely to a side surface 905sa of each of the wheel-shaped portions 905s. Then, if an electrostatic repulsive force is generated between the driven portion 905b and the respective excitation electrodes 906, the vibration body 905 rotates in a direction in which the wheel-shaped portions 905s are estranged from the excitation electrodes 906, and then, as shown in FIG. 21(A), the vibration body 905 is twisted in a counterclockwise direction in FIG. 21(A). Further, if an electrostatic attractive force is generated between the driven portion 905b and the respective excitation electrodes 906, the vibration body 905 rotates in a direction in which the wheel-shaped portions 905s come close to the excitation electrodes 906, and then, as shown in FIG. 21(B), the vibration body 905 is twisted in a clockwise direction in FIG. 21(B). Therefore, the electrostatic repulsive force and the electrostatic attractive force are alternately generated between the vibration body 905 and the respective excitation electrodes 906, such that the vibration body 905 vibrates in the twisted mode.

Moreover, the method for generating the twisted vibration in the vibration body 905 is not limited to the method in which the electrostatic repulsive force and the electrostatic attractive force are alternately applied as described above, but it may include a method in which any one of the electrostatic repulsive forces and the electrostatic attractive forces is periodically applied. Further, in the exemplary embodiment, the four excitation electrodes 906 are provided with respect to the vibration body 905, but the number of the excitation electrodes 906 may be arbitrarily set. In addition, in the above-mentioned exemplary embodiment, only one end (lower end) of the vibration body 905 is fixed, but the vibration body 905 may be supported from both ends.

In the present exemplary embodiment, similarly, the supporting portion 905a is connected to a center position of the driven portion 905b, such that the driven portion 905b is stably supported by the supporting portion 905a. Thus, even when the electrostatic force acts on the excitation electrodes 906, vibrations other than the twisted direction are difficult to be generated. Therefore, it is possible to vibrate in the twisted mode in a stable posture, and the loss of the vibration energy is little.

[Relationship of Vibration Mode and Natural Frequency]

Next, a relationship of the resonator using the twisted vibration, the resonator using the bending vibration and the resonator using the stretching vibration (longitudinal vibration) in the fifth and sixth exemplary embodiments will be described.

The natural frequency fb of the resonator using the twisted vibration, in which the vibration body is a bar-shaped body having a length L, is represented by the following equation:

$$fb = (Bn/2L)(G/\rho)^{1/2} \quad (1)$$

Here, Bn is a coefficient which is determined by conditions of bar ends of the vibration body and an order of the vibration. When the vibration body is fixed from both ends, Bn satisfies an expression of Bn=n=1, 2, 3, . . . , and when the vibration body is fixed in the cantilever manner, Bn satisfies an expression of Bn=n−1/2=1/2, 3/2, 5/2, . . . . Further, G satisfies G=E/2{2·(1+σ)} (E is Young's modulus, and σ is Poisson's ratio), and ρ is a density.

Meanwhile, the natural frequency fa of the vibration body using the bending vibration (curved vibration), in which the vibration body is a bar-shaped body having a length L, is represented by the following equation:

$$fa = (An/L^2)(EI/m)^{1/2} \quad (2)$$

Here, An is a coefficient which is determined by conditions of bar ends of the vibration body and an order of the vibration. When the vibration body is fixed from both ends, An satisfies an expression of A1=4.730, A2=7.853, A3=10.996 . . . (a solution of an equation of 1−cosh A·cos A=0), and when the vibration body is fixed in the cantilever manner, An satisfies an expression of A1=1.875, A2=4.694, A3=7.855 . . . (a solution of an equation of 1+cosh A·cos A=0). Further, E is Young's modulus, and I is a cross-sectional secondary moment. For example, when the cross-section is circular, an expression of I=πd⁴/64 (d is a diameter) is satisfied. m is a product of a sectional area S and a density ρ of the vibration body.

In addition, the natural frequency fs of the vibration body using the stretching vibration (longitudinal vibration), in which the vibration body is a bar-shaped body having a length L, is represented by the following equation:

$$fs = (Bn/2L)(E/\rho)^{1/2} \quad (3)$$

Here, Bn is a coefficient which is determined by conditions of bar ends of the vibration body and an order of the vibration. When the vibration body is fixed from both ends, Bn satisfies an expression of Bn=n=1, 2, 3, . . . , and when the vibration body is fixed in the cantilever manner, Bn satisfies an expression of Bn=n−1/2=1/2, 3/2, 5/2, . . . . Further, E is Young's modulus, and ρ is a density.

With comparing the twisted vibration and the bending vibration, the size of the natural frequency changes according to the length L of the vibration body. More specifically, the size of the natural frequency in each of the twisted vibration and the bending vibration changes with L=Lx= $(2An/Bn)\cdot(2(1+\sigma)I/S)^{1/2}$ (S is a sectional area of the vibration body) as a boundary. That is, when the length L of the vibration body becomes longer than Lx, the natural frequency in the twisted vibration becomes higher than that in the bending vibration, and when the length L of the vibration body becomes shorter than Lx, the natural frequency in the bending vibration becomes higher than that in the twisted vibration. In a related art practical range, according to a relationship of the length L and the sectional area S, the natural frequency in the twisted vibration becomes higher than that in the bending vibration. Further, in the bending vibration, actually, the frequency increases as L becomes small, but, on the contrary, the vibration displacement becomes small. Thus, the ratio of the output voltage to the input voltage becomes small.

Further, with comparing the twisted vibration and the stretching vibration (longitudinal vibration), a ratio of the natural frequencies of them satisfies an expression of $[1/\{2\cdot(1+\sigma)\}]^{1/2}$. Further, the natural frequency in the twisted vibration is constantly lower than that in the stretching vibration, but the difference is a little. Meanwhile, in the twisted vibration, the vibration body has a shape or the like comprising the supporting portion and the magnified driven portion, like the above-mentioned exemplary embodiment, and thus, the vibration displacement can become large. However, in the stretching vibration, the vibration displacement is small, and the ratio of output voltage to the input voltage is small.

As described above, in the present exemplary embodiment, by using the twisted vibration mode, it is possible to realize higher frequency to a certain degree, and it is possible to secure the large vibration displacement. Thus, it is possible to enlarge the ratio of the output voltage to the input voltage, and it is possible to design the reduction of the input voltage.

Moreover, the micromechanical electrostatic resonator of exemplary embodiments of the present invention is not limited to the above-mentioned examples shown in the drawings, but it can be variously modified within a range without departing from the subject matter of the present invention. For example, in the fifth and sixth exemplary embodiments, a plate-shaped portion of the vibration body on which the electrostatic force acts is connected to the cylindrical supporting portion, but the present invention is not limited to such a planar shape. It is enough that the driven portion has a shape which is stretched in the magnified range more than the supporting portion. For example, the bar-shaped driven portion stretched outside the radius direction from the portion which is connected to the supporting portion may be used. Further, in the vibration bodies of the fifth and sixth exemplary embodiments, the supporting portion is connected to the center position of the driven portion, but the supporting portion may be connected to a position which is shifted from the center position of the driven portion. In addition, in the fifth and sixth exemplary embodiments, it is basically constructed such that the electrostatic force acts on the driven portion, and then the supporting portion is twisted and deformed. However, in exemplary embodiments of the present invention, the driven portion, along with the supporting portion, may be twisted and deformed, or the driven portion may be mainly twisted and deformed while the supporting portion is almost never deformed.

[Seventh Exemplary Embodiment]

Figure 22A:
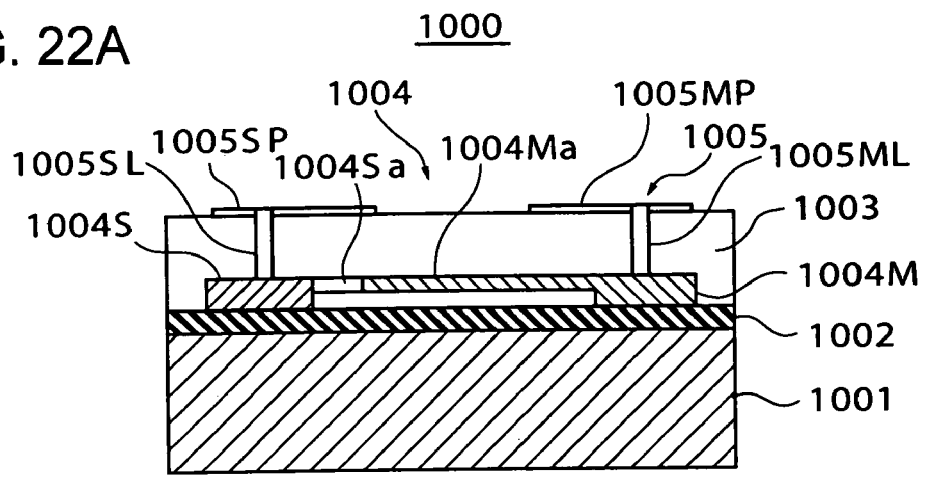
FIGS. 22(A) and (B) are a schematic longitudinal cross-sectional view and a schematic plan view of a seventh exemplary embodiment.
Figure 22B:
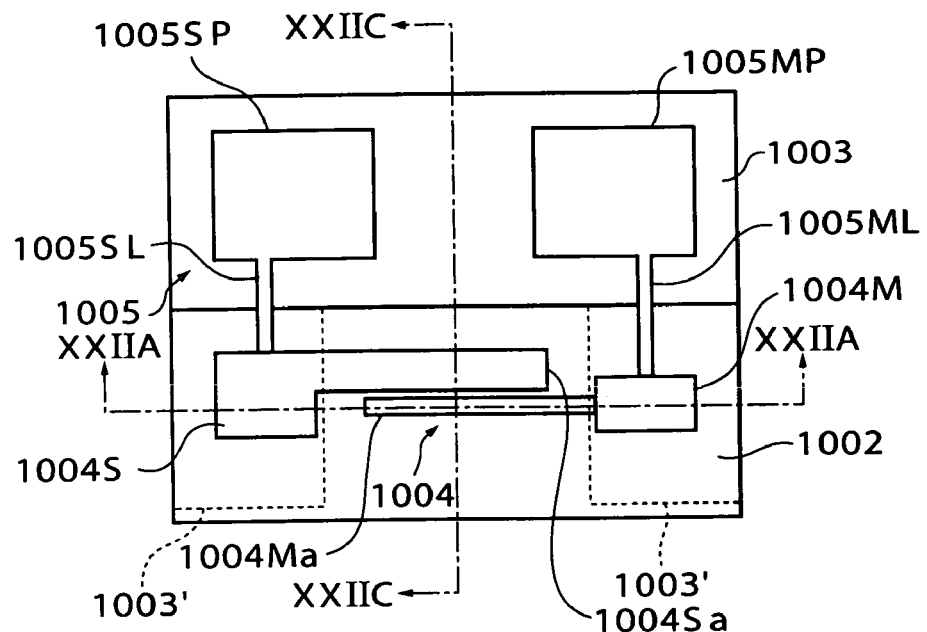
FIG. 22(C) is a schematic longitudinal cross-sectional view showing a cross-section along a direction orthogonal to the cross-section shown in FIG. 22(A)
Figure 22C:
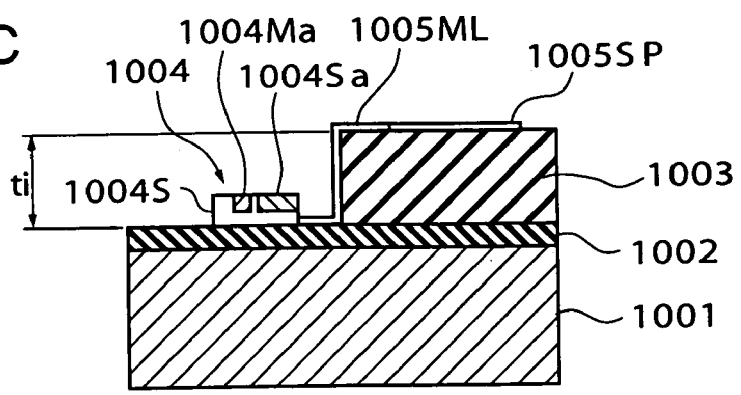

FIGS. 22A–C are schematic longitudinal cross-sectional views showing a micromechanical electrostatic resonator 1000 according to a seventh exemplary embodiment of the present invention. More specifically, FIG. 22(A) is a schematic cross-sectional view taken along line XXIIA—XXIIA of FIG. 22(B), FIG. 22(B) is a schematic plan view, and FIG. 22(C) is a schematic cross-sectional view showing cross-section taken along line XXIIC—XXIIC of FIG. 22(B) (cross-section orthogonal to the cross-section shown in FIG. 22(A)).

The basic construction of the micromechanical electrostatic resonator 1000 includes a substrate 1001 made of a silicon substrate, a glass substrate, a quartz substrate, a ceramic substrate or the like, and an insulating layer 1002 made of metallic oxides such as $SiO_2$, PSG (phosphorus doped glass), $TiO_2$ or $Ta_2O_5$, silicon nitrides such as $Si_3N_4$, or synthetic resins such as acryl resin, formed on the substrate 1001. The insulating layer 1002 is intended to isolate the substrate and a conductive material thereon when the substrate 1001 is a substrate made of a conductive material or a semiconductor substrate.

When the substrate 1001 is the silicon substrate, the substrate made of the conductive material or the semiconductor substrate, the substrate 1001 may have conductance to a certain degree or the insulation such as an intrinsic semiconductor. In the former, the insulating layer 1002 is specifically needed. Further, in the latter, the insulating layer 1002 is not necessarily needed. In addition, as the substrate 1001, an insulator such as a glass substrate, a quartz substrate or a ceramic substrate may also be used. In this case, similarly, the insulating layer 1002 is not needed. Moreover, when the substrate 1001 having the insulation is used, a conductive film such as a wiring pattern may be formed on the surface of the substrate 1001. In this case, the insulating layer 1002 may be needed to secure the insulation from an upper layer. As the insulating layer 1002, an insulating layer covering a surface of a silicon substrate on which a semiconductor integrated circuit is constructed may be used as it is.

On the insulating layer 1002, a resonator structure 1004 is formed, and the resonator structure 1004 is an electrode portion comprising electrode layers 1004S and 1004M, which are made of polysilicon or the like. Here, an electrode 1004Sa of the electrode layer 1004S and an electrode 1004Ma of the electrode layer 1004M together are arranged oppositely to each other in a shape estranged from a lower layer (the insulating layer 1002). In this exemplary embodiment, it is constructed such that a predetermined voltage is applied between the electrode layers 1004S and 1004M, the electrostatic force is generated between the electrodes 1004Sa and 1004Ma, and then the electrode 1004Ma mainly moves in a direction which comes close to and is estranged from the electrode 1004Sa. In this situation, it may be constructed such that the electrode 1004Sa is fixed to the lower layer, and only the electrode 1004Ma is estranged from the lower layer. Further, it may be constructed such that both the electrodes 1004Sa and 1004Ma move together.

Further, in a region adjacent to a region in which the resonator structure 1004 is to be formed, an insulating layer 1003 is formed. The insulating layer 1003 is provided at one side of the region in which the resonator structure 1004 is to be formed in FIGS. 22A–C, but the insulating layers 1003 may be formed respectively at both sides of the region in which the resonator structure 1004 is to be formed. The insulating layer 1003 is made of metallic oxides such as SiO$_2$, PSG (phosphorus doped glass), TiO$_2$ or Ta$_2$O$_5$, silicon nitrides such as Si$_3$N$_4$, synthetic resins such as acryl resin, or the like. The insulating layer 1003 is preferably made of a material having a low dielectric constant, in particular, having a dielectric constant lower than that of the insulating layer 1002. In order to lower the dielectric constant of the insulating layer 1003, the insulating layer 1003 may be made of a material having an essentially low dielectric constant or may be made of a porous material. Alternatively, a method in which a space is provided as described below may be used. As the porous material, porous silica, for example, mesoporous silica may be used. The thickness ti of the insulating layer 1003 is preferably thicker than that of at least the insulating layer 1002.

On the surface (upper surface) of the insulating layer 1003, wiring portions 1005SL and 1005ML are stretched so as to be conductively connected to the electrode layers 1004S and 1004M. Further, connection terminals 1005SP and 1005MP which are conductively connected to the wiring portions 1105SL and 1005ML respectively are provided. The wiring portions 1005SL and 1005SL and the connection terminals 1005SP and 1005MP constitute the above-mentioned wiring layer. The wiring layer is preferably made of a good conductor such as aluminum.

In the present exemplary embodiment, the electrode layers 1004S and 1004M are formed on the insulating layer 1002, and a portion of the wiring portions 1005SL and 1005ML and the connection terminals 1005SP and 1005MP are formed on the insulating layer 1003 which is deposited on the insulating layer 1002. However, the entire portions of the wiring portions 1005SL and 1005ML may be constructed on the insulating layer 1003. In addition, as shown in a dot line in FIG. 22(B), an extended portion 1003' of the insulating layer 1003 may be formed, such that portions other than the electrodes 1004Sa and 1004Ma of the electrode layers 1004S and 1004M may be formed on the insulating layer 1003. Further, in the present exemplary embodiment, a pair of axis-shaped electrode layers 1004S and 1004M are arranged oppositely to each other in parallel, but, like a related art structure, comb teeth-shaped electrodes may be arranged oppositely to each other in a state in which the same electrodes engage with each other.

The micromechanical electrostatic resonator 1000 of the present exemplary embodiment is constructed such that the electrodes 1004Sa and 1004Ma are provided to be arranged oppositely to each other in the above-mentioned resonator structure 1004, and at least one of the electrodes vibrates. In FIGS. 22A–C, it is constructed that one electrode 1004Ma which mainly vibrates is the vibration body, and other electrode 1004Sa is the excitation electrode. However, instead of the electrode 1004Ma, the vibration bodies or the driven portions in the first to sixth exemplary embodiments may be provided, and, instead of the electrode 1004Sa, the excitation electrodes in the first to sixth exemplary embodiments may be provided. If doing so, it may be constructed such that the wiring layer is provided so as to be connected to the vibration body or the excitation electrode in the first to sixth exemplary embodiments, and the distance from the wiring layer to the substrate becomes larger than the distance from the vibration body or the excitation electrode to the substrate. Thus, it is possible to reduce the parasitic capacitance between the resonator structure and the substrate.

Figure 23:
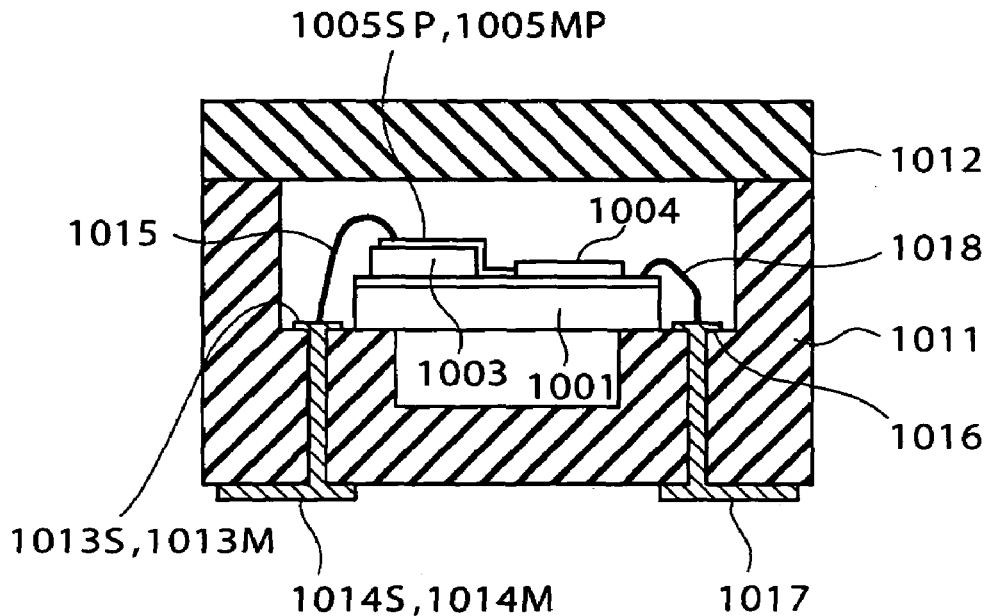
FIG. 23 is a schematic longitudinal cross-sectional view showing a structure of a package in the seventh exemplary embodiment.

FIG. 23 is a schematic longitudinal cross-sectional view showing a state in which the micromechanical electrostatic resonator 1000 of the present exemplary embodiment is enveloped in a package. The micromechanical electrostatic resonator 1000 operates by allowing the electrode 1004Ma of the electrode layer 1004M to be mechanically vibrated. Thus, the micromechanical electrostatic resonator 1000 is preferably housed in packages 1011 and 1012 which are made of an insulating material such as ceramics or synthetic resin. In particular, in order to facilitate the vibration the electrode, the inside of the package is preferably in a vacuum state (vacuum package). In the package 1011, internal terminals 1013S and 1013M, and external terminals 1014S and 1014M which are conductively connected to the internal terminals 1013S and 1013M respectively are formed. Further, the connection terminals 1005SP and 1005MP are conductively connected to the internal terminals 1013S and 1013M via conductive wires 1015 or the like respectively.

Further, in the micromechanical electrostatic resonator 1000 of the present exemplary embodiment, since the substrate 1001 is made of the silicon substrate or the like, it is possible to provide a predeterminated circuit structure (for example, a semiconductor integrated circuit) within the substrate 1001. In this case, an internal terminal 1016 and an external terminal 1017 conductively connected to the internal terminal 1016 may be provided, and the circuit structure may be conductively connected to the internal terminal 1016 via a conducive wire 1018 or the like. If doing so, it is possible to construct the micromechanical electrostatic resonator 1000 and a predetermined circuit structure as a body. Moreover, in the present exemplary embodiment, the micromechanical electrostatic resonator 1000 is housed in the packages 1011 and 1012, but it may be directly mounted on a circuit board, like a surface mounted device (SMD).

[Manufacturing Method]

Figure 25A:
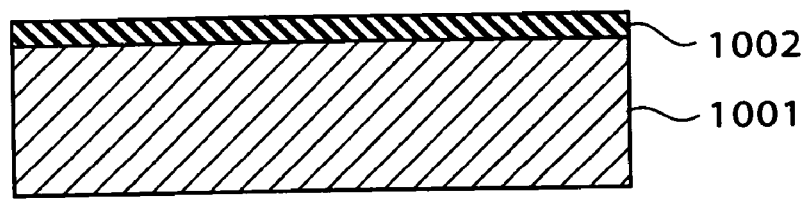
FIGS. 25(A) to (C) are cross-sectional views showing a manufacturing method of the seventh exemplary embodiment.

Next, a manufacturing method of the seventh exemplary embodiment will be described with reference to FIGS. 25A–C. First, as shown in FIG. 25(A), the insulating layer 1002 is formed on the surface of the substrate 1001. The insulating layer 1002 may be directly film-formed with the CVD method or the like, or formed by coating a liquid or paste-shaped base material with a spin coating method, a roll coating method, a printing method or the like, and by hardening the base material with a heat treatment or the like.

Figure 25B:
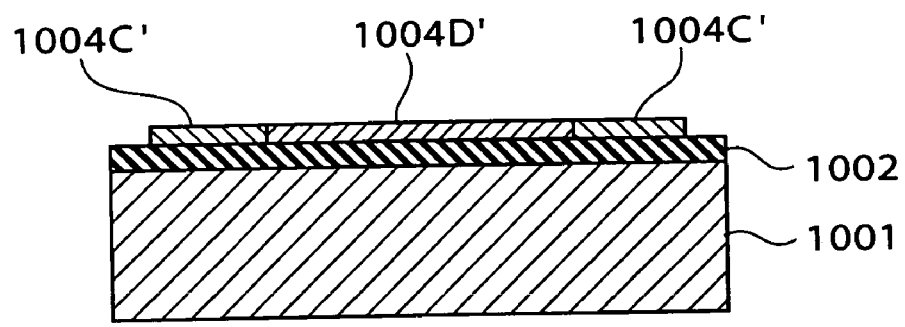
Figure 25C:
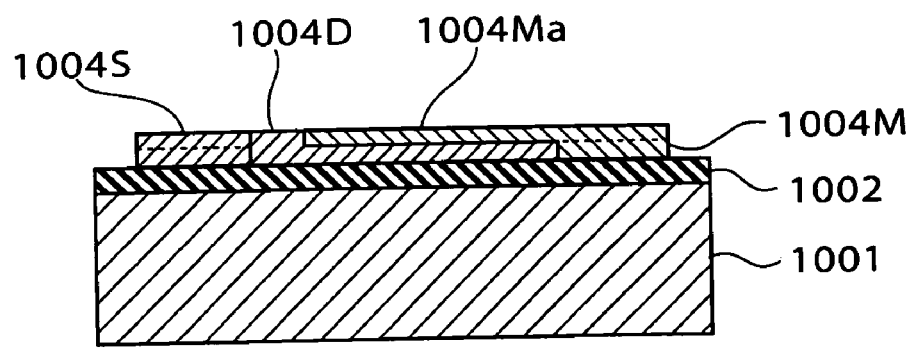

Next, as shown in FIG. 25(B), a first conductor layer 1004C' made of polysilicon or the like and a first sacrificing layer 1004D' made of SiO$_2$, PSG (phosphorus doped glass), organic resin or the like are formed on the insulating layer 1002. These layers can be easily constructed with the photolithography method or the like respectively. And then, the same conductor material is further arranged on the first conductor layer 1004C', and the same sacrificing material is further arranged on the first sacrificing layer 1004D'. By doing so, as shown in FIG. 25(C), the electrode layers 1004S and 1004M including the electrodes 1004Sa and 1004Ma (1004Sa is not shown) which are supported by the sacrificing layer 1004D are formed. Here, the respective conductor layers can be formed with the CVD method, the sputtering method or the like, and the sacrificing layer can be formed with the sputtering method, a sol-gel method or the like.

Figure 26A:
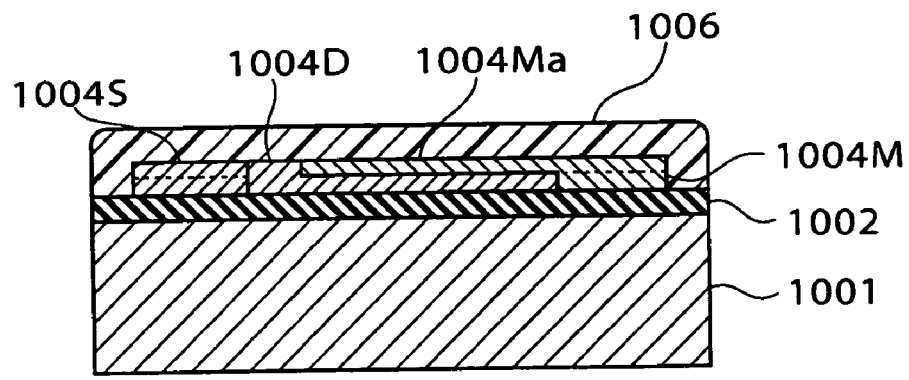
FIGS. 26(A) to (C) are cross-sectional views showing the manufacturing method of the seventh exemplary embodiment.
Figure 26B:
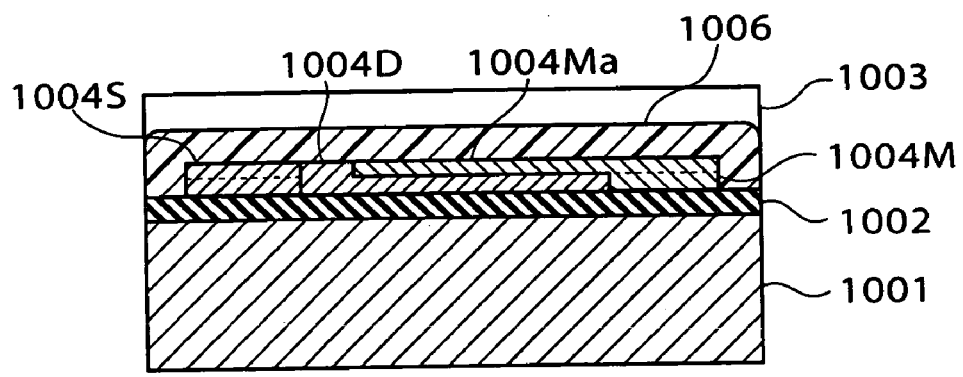

Next, as shown in FIG. 26(A), the electrode structure constructed in such a manner is covered with a protective layer 1006 made of PSG or synthetic resin, and as shown in FIG. 26(B), the insulating layer 1003 is formed using masking method, lift-off method, photolithography method or the like in the region adjacent to regions in which the electrodes are to be formed. The insulating layer 1003 can be constructed with the same method as that of the insulating layer 1002, but, when the insulating layer 1003 is made of a porous material, the sol-gel method may be used. For example, porous silica can be constructed by coating liquid containing a glass constituent material such as alkoxysilane and drying the liquid (volatilizing a solvent such as alcohol).

In the present exemplary embodiment, the insulating layer 1003 is not formed in the operation regions on which the electrodes 1004Sa and 1004Ma operate. As a method of selectively forming the insulating layer 1003, a masking method, a lift off method, the photolithography method or the like can be used. In such a manner, since the insulating layer 1003 is partially formed on the substrate 1001, it is effective to reduce or prevent a curve or the like of the substrate 1001 which can be caused by forming the insulating layer 1003 on an entire surface of the substrate 1001. Further, since the insulating layer 1003 may be formed at both sides of each of the operation regions, or it may be formed to surround the operation regions, it is advantageous that the fragile electrode structure having movable portions which is constructed on the operation regions can be protected in production process.

Figure 26C:
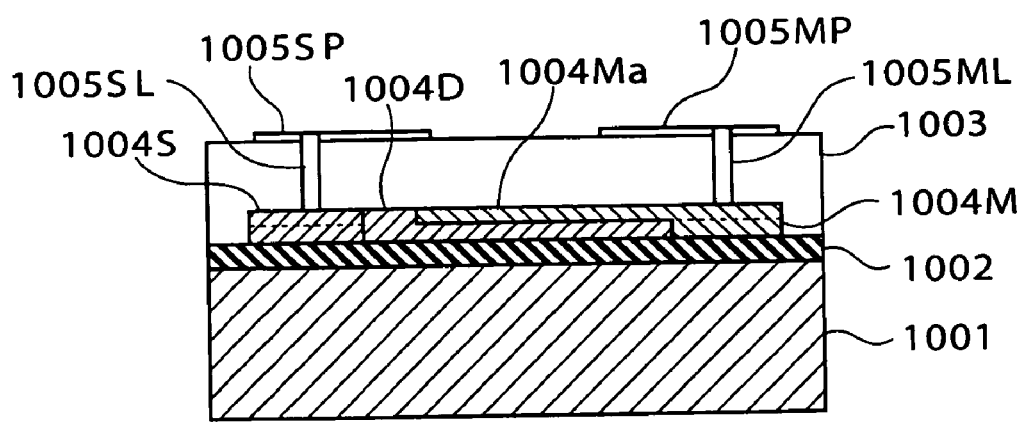

Subsequently, the protective layer 1006 is removed, and a conductor such as aluminum is film-formed on the surfaces of the insulating layers 1002 and 1003 with the vapor deposition method, the sputtering method or the like and is patterned with the photolithography method. Thus, as shown in FIG. 26(C), the above-mentioned wiring layer, that is, the wiring portions 1005SL and 1005ML and the connection terminals 1005SP and 1005MP are formed. And then, finally, the sacrificing layer 1004D is removed by etching or the like, such that the resonator structure shown in FIG. 22 is formed.

[Operation]

Figure 27:
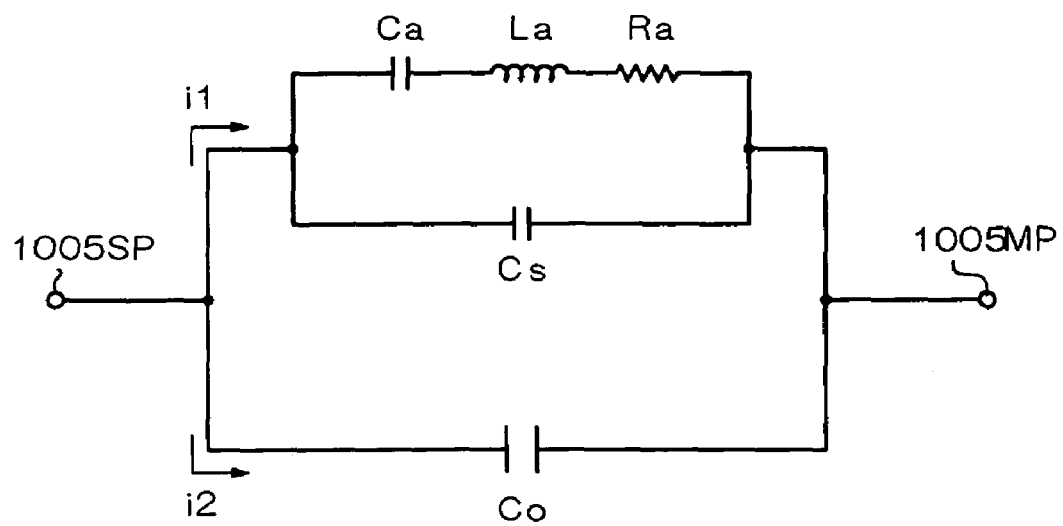
FIG. 27 is an equivalent circuit diagram of the seventh exemplary embodiment.

FIG. 27 is an equivalent circuit diagram of the micromechanical electrostatic resonator according to the above-mentioned exemplary embodiment. In an equivalent circuit of the micromechanical electrostatic resonator 1000, there are a series circuit including a capacitance Ca, an inductance La and a resistance Ra between the connection terminals 1005SP and 1005MP, a parallel capacitance (short capacitance) Cs circuit which is connected in parallel to the series circuit. Here, the series circuit portion is a portion having an input/output characteristic of the electrostatic resonator, and the short capacitance Cs corresponds to normal components of the capacitance between the electrodes 1004Sa and 1004Ma.

In the micromechanical electrostatic resonator 1000 of the present exemplary embodiment, in parallel with the circuit construction, there is additionally a parasitic capacitance Co which is a capacitance between the electrode layers 1004S and 1004M, the wiring portions 1005SL and 1005ML, and the connection terminals 1005SP and 1005MP, and the substrate. As described above, the wiring layers including the wiring portions 1005SL and 1005ML and the connection terminals 1005SP and 1005MP is spaced apart from the substrate 1001 more than the electrodes 1004Sa and 1004Ma by the thickness ti of the insulating layer 1003 (see FIG. 22(C)), which results in reducing the parasitic capacitance Co. That is, according to an equation of $C=\in S/t$ (C is a capacitance, $\in$ is a dielectric constant, S is an electrode area, and t is an inter-electrode distance), the capacitance generated between the wiring layers and the substrate 1001 becomes small as the inter-electrode distance t becomes large by the thickness ti of the insulating layer 1003. Further, according to the above-mentioned equation, if the dielectric constant of the insulating layer 1003 becomes smaller than the dielectric constant of the insulating layer 1002 (corresponding to the insulator claimed in claim 18), since the dielectric constant $\in$ becomes substantially small, the capacitance becomes further small.

As described above, since the wiring layers are estranged from the substrate 1001 more than the electrodes such that the parasitic capacitance Co becomes small, an electric energy which is distributed in the capacitances Co, Cs and Ca is mainly distributed in Cs and Ca. As a result, it is possible to increase the output voltage of the micromechanical electrostatic resonator 1000, and further it is possible to reduce the drive voltage.

Figure 28:
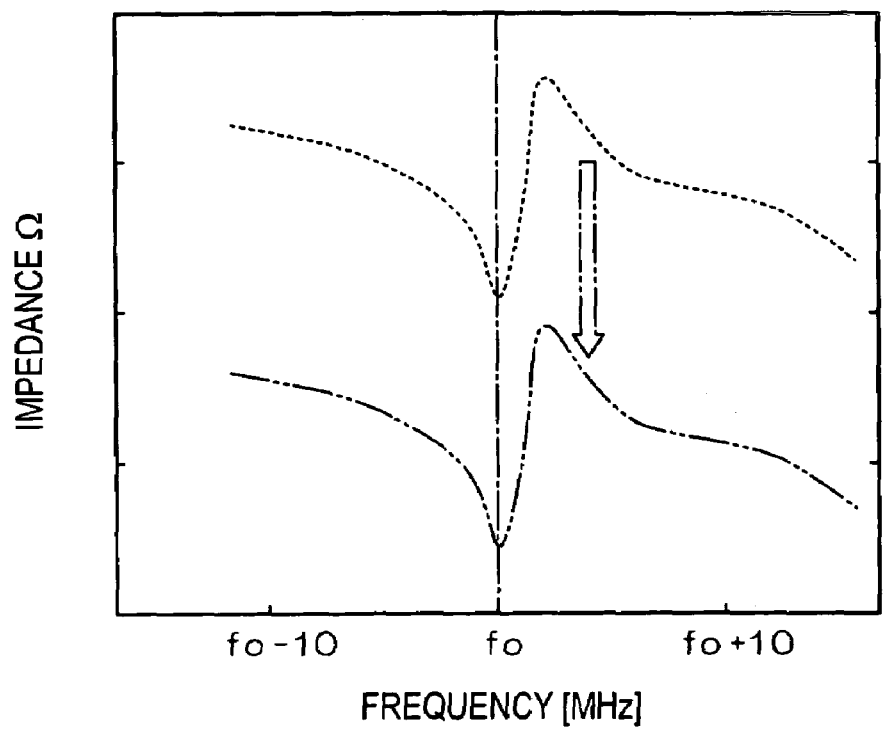
FIG. 28 is a graph showing insertion losses and frequency characteristics of impedances in the seventh exemplary embodiment.

FIG. 28 is a graph showing schematically frequency dependence of impedance in the micromechanical electrostatic resonator 1000 according to the present exemplary embodiment. Here, a dash-dot-dot line shown in FIG. 28 represents impedance in the present exemplary embodiment, and a dot line shown in FIG. 28 represents impedance in an electrostatic resonator having a related art structure. According to such a construction, it is possible to make the parasitic capacitance Co small, and thus impedance in the present exemplary embodiment is reduced as compared with the related art structure.

Moreover, in the above-mentioned exemplary embodiment, the insulating layer 1003 is partially deposited on the insulating layer 1002, but the insulating layer 1002 may be formed definitely in the operation regions and the insulating layer 1003 may be formed directly on the substrate 1001 in regions adjacent to the operation regions. Further, a unified insulating layer may be formed on the substrate, and then portions formed on the operation regions among the insulating layer may be selectively etched to be thinned such that the same surface steps as those of the above-mentioned exemplary embodiment are formed.

[Eighth Exemplary Embodiment]

Figure 24:
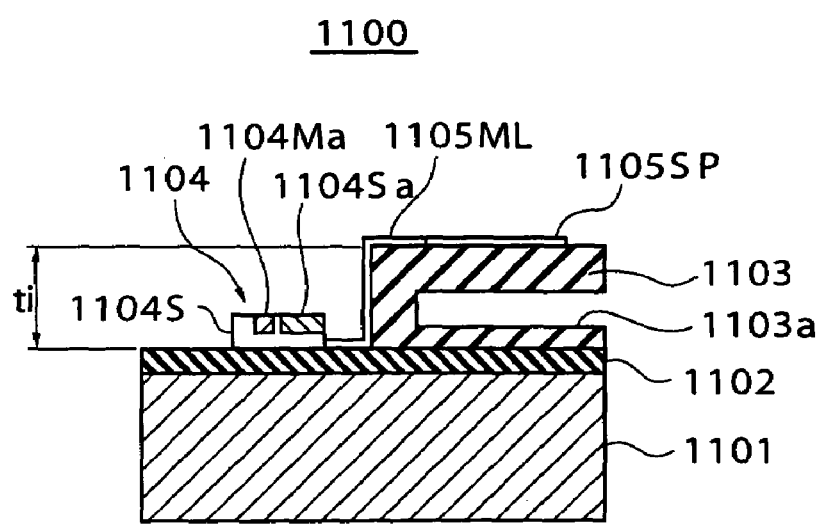
FIG. 24 is a schematic longitudinal cross-sectional view of an eighth exemplary embodiment.

FIG. 24 is a schematic longitudinal cross-sectional view showing a micromechanical electrostatic resonator 1100 according to an eighth exemplary embodiment of the present invention. In this exemplary embodiment, a substrate 1101, an insulating layer 1102, electrode layers 1104S and 1104M, electrodes 1104Sa and 1104Ma, wiring portions 2005SL and 2005ML and connection terminals 2005SP and 2005MP are the same as those of the first exemplary embodiment, and thus the descriptions on these elements will be omitted.

The micromechanical electrostatic resonator 1100 is the same as that of the seventh exemplary embodiment in that wiring layers comprising the wiring portions 1105SL and 1105ML and the connection terminals 1105SP and 1105MP are constructed on the insulating layer 1103. However, a space 1103a is provided inside the insulating layer 1103. Thus, a substantial dielectric constant of a dielectric between the wiring layers and the substrate 1101 is further lowered less than the dielectric constant of the insulating layer 1103 by the thickness of the space 1103a. Therefore, the capacitance between the wiring layers and the substrate 1101 is further lowered. As a result, it is possible to further reduce the above-mentioned parasitic capacitance Co.

The space 1103a may be constructed, for example, by forming a sacrificing layer (not shown) which may be made of polysilicon, PSG, organic resin or the like) after forming a first layer of the insulating layer 1103, further depositing a second layer of the insulating layer 1103 on the sacrificing layer, and then removing the sacrificing layer with etching or the like.

In the present exemplary embodiment, the space is formed inside the insulating layer 1103, but the present invention is not limited to this aspect. The space may be provided between the insulating layer 1103 and the wiring layers, or it may be provided between the insulating layer 1103 and the insulating layer 1102. It is enough that the space 1103a is provided between the wiring layers and the substrate 1101.

[Ninth Exemplary Embodiment]

Figure 29:
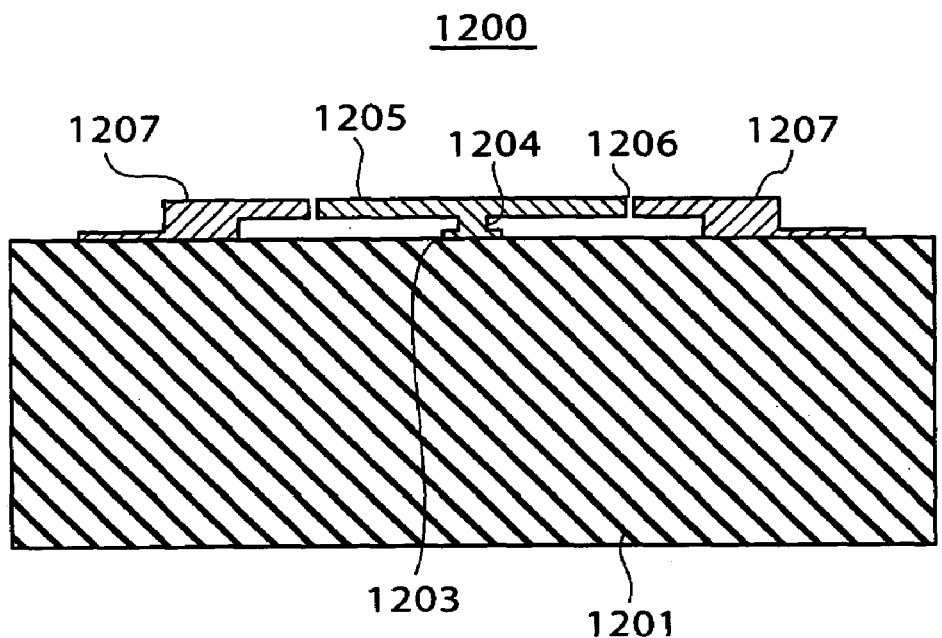
FIG. 29 is a schematic longitudinal cross-sectional view showing a ninth exemplary embodiment.

FIG. 29 is a longitudinal cross-sectional view of a micromechanical electrostatic resonator according to a ninth exemplary embodiment of the present invention. The micromechanical electrostatic resonator 1200 includes a resonator structure. Further, the resonator structure includes, on a substrate 1201 made of an insulator such as glass, quartz or ceramics, an output electrode 1203, a supporting portion 1204 conductively connected to the output electrode 1203, a vibration body 1205 conductively connected to and supported by the supporting portion 1204, and a pair of excitation electrodes 1207 and 1207 which are arranged oppositely to an outer edge of the vibration body 1205 at both sides of the vibration body 1205. Moreover, in this exemplary embodiment, the resonator structure constructed on the substrate 1201 has the same construction as that of the first exemplary embodiment, and thus the detailed description of the resonator structure will be omitted.

In the present exemplary embodiment, since the substrate 1201 is made of the insulator, the parasitic capacitance is not generated between the resonator structure and the substrate 1201. Thus, it is possible to reduce or prevent the output voltage or energy efficiency from being lowered due to the parasitic capacitance. This is the same as those described in the seventh and eighth exemplary embodiments, and thus the detailed description thereon will be omitted. However, in the present exemplary embodiment, since the substrate 1201 is made of the insulator, the parasitic capacitance is almost never generated, unlike the seventh and eighth exemplary embodiments in which the parasitic capacitance between the substrate and an upper layer is reduced. Thus, the present exemplary embodiment has a more efficient construction. In particular, if the substrate 1201 is made of glass, a substrate material can be obtained at low cost, and various treatments can be easily performed during the manufacture. Therefore, it is possible to reduce the manufacturing cost.

[Tenth Exemplary Embodiment]

Figure 30:
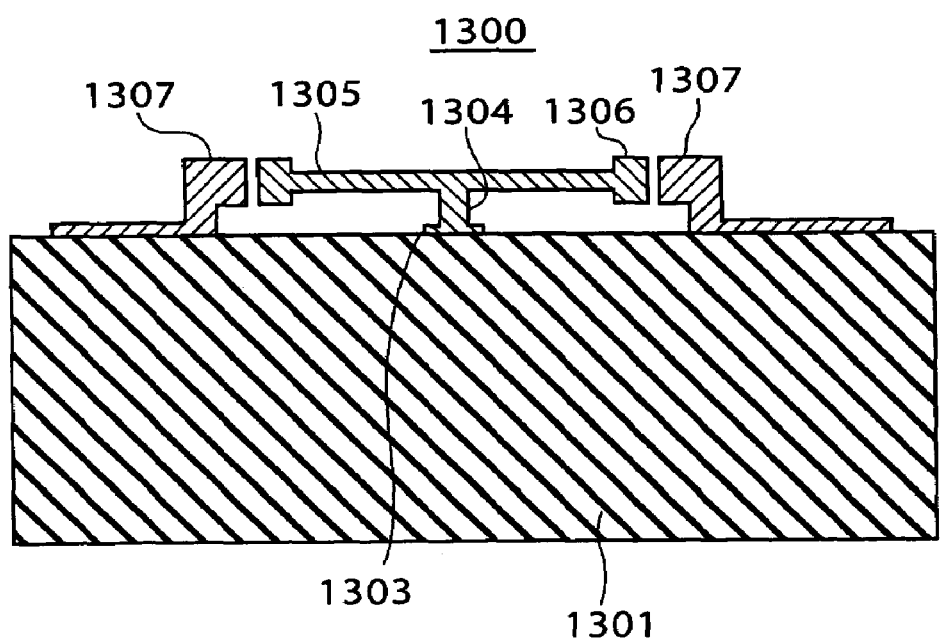
FIG. 30 is a schematic longitudinal cross-sectional view showing a tenth exemplary embodiment.

FIG. 30 is a longitudinal cross-sectional view of a micromechanical electrostatic resonator according to a tenth exemplary embodiment of the present invention. The micromechanical electrostatic resonator 1300 includes a resonator structure. Further, the resonator structure includes, on a substrate 1301 made of an insulator such as glass, quartz or ceramics, a reference electrode 1303, a supporting portion 1304 conductively connected to the reference electrode 1303, a vibration body 1305 conductively connected to and supported by the supporting portion 1304, and a pair of excitation electrodes 1307 and 1307 which are arranged oppositely to an outer edge of the vibration body 1305 at both sides of the vibration body 1305. Moreover, in this exemplary embodiment, the resonator structure constructed on the substrate 1301 has the same construction as that of the third exemplary embodiment, and thus the detailed description of the resonator structure will be omitted.

In the present exemplary embodiment, since the substrate 1301 is made of the insulator, the parasitic capacitance is not generated between the resonator structure and the substrate 1301. Thus, it is possible to reduce or prevent the output voltage or energy efficiency from being lowered due to the parasitic capacitance. This is the same as that described in the ninth exemplary embodiment. Further, if the substrate 1301 is made of glass, a substrate material can be obtained at low cost, and various treatments can be easily performed during the manufacture. Therefore, it is possible to reduce the manufacturing cost.

Further, in the second, fourth and eighth exemplary embodiments, similarly to the ninth and tenth exemplary embodiments, the substrate may be made of the insulator. In these cases, the insulating layer to be formed on the substrate is not needed. However, the insulating layer may be formed for other objects, for example, for smoothing the surface of the substrate or for raising close adherence of the resonator structure which is formed on the substrate.

[Eleventh Exemplary Embodiment]

FIGS. 31A–C and 32A–C are diagrams showing a manufacturing method of a micromechanical electrostatic resonator according to an eleventh exemplary embodiment. Here, the present exemplary embodiment exemplifies a case in which the micromechanical electrostatic resonator 1200 of the ninth exemplary embodiment is manufactured. In FIGS. 31 and 32, the same reference numerals as those of FIG. 29 represent the same elements. Further, in the following description, a case in which the micromechanical electrostatic resonator 1200 is manufactured using a SOI (Silicon On Insulator) substrate 1260 is exemplified, but, when an insulating film and a polysilicon (p-SiO) film are formed on the silicon substrate 1261, the micromechanical electrostatic resonator 1200 can be manufactured with the almost same steps as those when using the SIO substrate 1260.

Figure 31A:
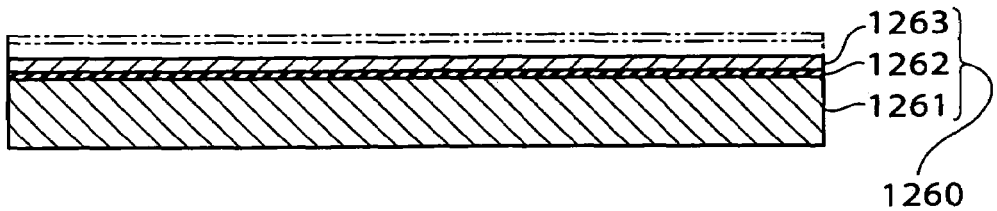
FIGS. 31(A) to 31(C) are schematic diagrams showing a manufacturing method of an eleventh exemplary embodiment.

In the present exemplary embodiment, as shown in FIG. 31(A), the SIO substrate 1260 in which an insulating film 1262 made of silicon dioxide ($SiO_2$) as the insulating film, and a silicon layer 1263 as a semiconductor layer are sequentially formed on the silicon substrate 1261 with a decompressed vapor growing method (decompressed CVD (Chemical Vapor Deposition)) is used. Both surfaces of the silicon substrate 1261 are polished, and the thickness thereof is about 500 µm. Further, the insulating film 1262 is formed to have a thickness of about 0.1 µm, and the silicon layer 1263 is formed to have a thickness of about 10 to 20 µm.

First, over an entire upper surface of the silicon layer 1263 formed on the SOI substrate 1260 shown in FIG. 31(A), photoresist (not shown) is coated, and then an exposure treatment and a development treatment are performed on the photoresist, such that a resist pattern having a predetermined shape is formed. In the resist pattern formed in such a manner, an opening is formed in a region in which the resonator structure shown in FIG. 29 is to be formed. More specifically, in regions in which the vibration body 1205 and the excitation electrodes 1207 are to be formed, the openings are formed. However, in regions in which the output electrode 1203 and the supporting portion 1204 are to be formed, the openings are not formed.

Next, an etching treatment is performed on the silicon layer 1263 on the SOI substrate 1260 with the resist pattern as a mask, and the silicon layer 1263 is removed by several µm. If the etching treatment is completed, as shown FIG. 31(B), in regions of the silicon layer 1263 in which the vibration body 1205 and the supporting portion 1204 are to be formed, concave portions 1263a are formed. However, regions 1263*b* of the silicon layer 1263*a* in which the output electrode 1203 and the supporting portion 1204 are to be formed remain. And then, the resist pattern which is formed on the silicon layer 1263 is removed. These constitute the concave portion forming step.

Figure 31B:
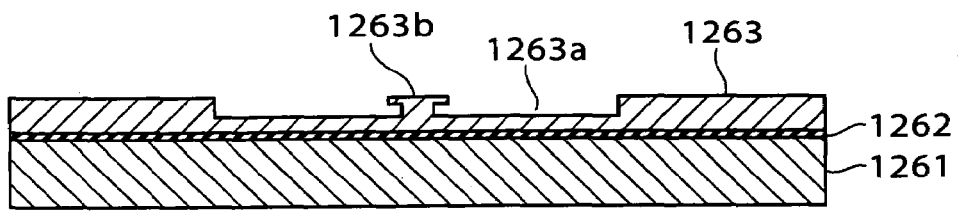
Figure 31C:
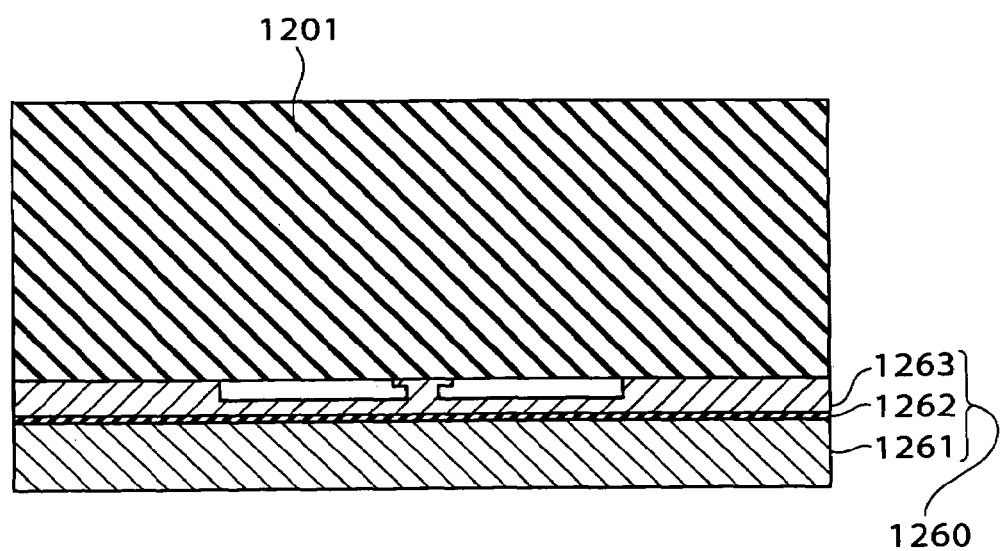

Moreover, in the above-mentioned step, instead of forming the concave portions 1263*a* by etching, a surface structure including the concave portions 1263*a* shown in FIG. 31(B) may be formed by repetitively depositing a patterned silicon layer as shown in FIG. 31(A).

Next, the silicon layer 1263 formed on the SOI substrate 1260 and a surface of the substrate 1201 made of glass or the like are joined to face to each other by an anodization joining. Here, the anodization joining is a method for closely joining the insulating substrate such as glass and the silicon substrate or a metallic material. According to this method, the overlapped substrates are heated, and a high voltage is applied between both substrates, in which the silicon substrate functions as an anode. Thus, an electric double layer is generated, such that the substrates are joined by the electrostatic attractive force. If the substrate 1201 is the glass substrate, the glass substrate is heated to be softened. By using the anodization joining, the SOI substrate 1260 is joined on the substrate 1201, as shown in FIG. 25(C). Moreover, preferably, when the SOI substrate 1260 and the substrate 1201 are joined by the anodization joining, an electrode is previously formed on the substrate 1201, and the electrode and the portion of the silicon layer 1263 in which the output electrode 1203 or the excitation electrode 1207 is to be formed are electrically connected to each other. These are the substrate joining step.

If the above step is completed, thinning of the SOI substrate 1260 joined to the substrate 1201 is preformed. In this treatment, using the insulating film 1262 of the SOI substrate 1260 as an etching stopper layer, the silicon substrate 1261 is removed by etching. In this situation, in regard to etching, wet etching or dry etching may be used. In the case of using dry etching, for example, inductive coupling plasma (ICP) or the like may be used. Moreover, preferably, prior to etching, the silicon substrate 1261 is grinded (coarse polishing) just until the insulating film 1262 is exposed, and then remaining silicon substrate 1261 is removed by etching. If doing so, it is possible to reduce the treatment time and improve productivity. In order to grind the silicon substrate 1261, a CMP method (chemical mechanical polishing method) is preferably used.

Figure 32A:
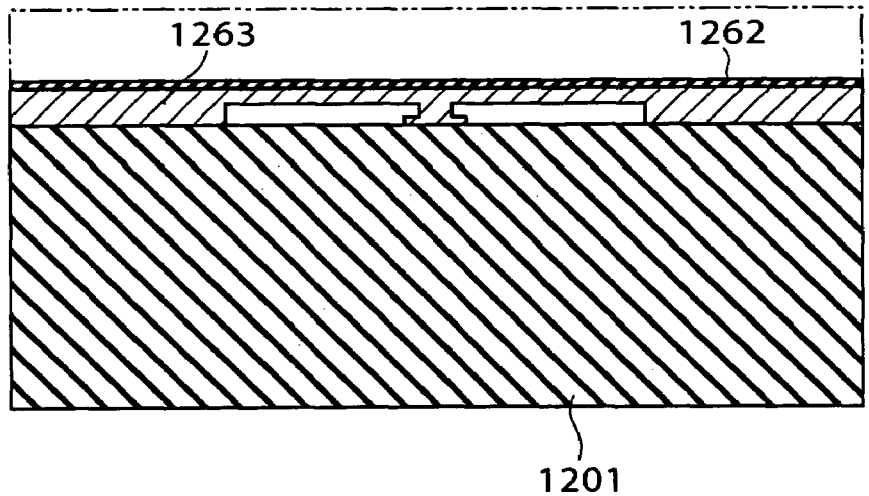
FIGS. 32(A) to 32(C) are schematic diagrams showing the manufacturing method of the eleventh exemplary embodiment.
Figure 32B:
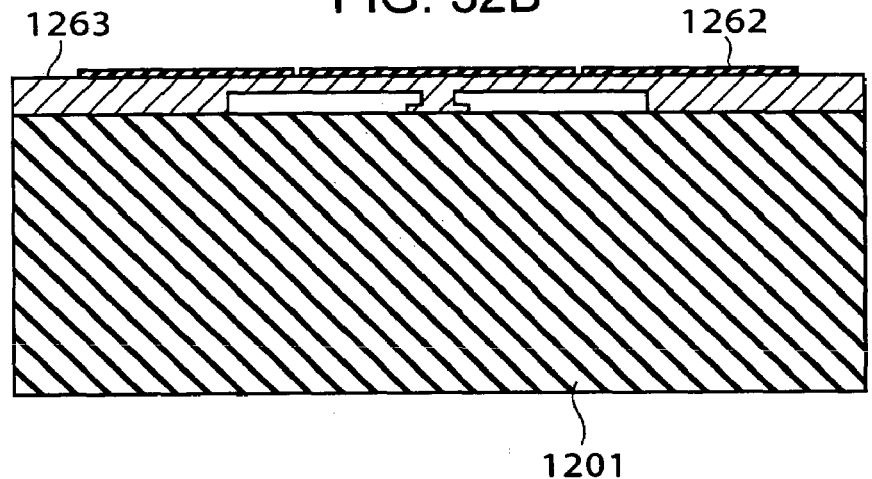

If the silicon substrate 1261 is removed, as shown in FIG. 32(A), the silicon layer 1263 and the insulating film 1262 will be formed on the substrate 1201. Next, photoresist (not shown) is coated over an entire surface of the insulating film 1262, and the exposure treatment and the development treatment are performed on the photoresist, such that a resist pattern having a predetermined shape is formed. Next, with the resist pattern as a mask, an etching treatment is performed on the insulating film 1262, and, as shown in FIG. 32(B), a mask for D-RIE (Deep Reactive Ion Etching) is formed. If the formation of the mask is completed, the resist pattern formed on the insulating film 1262 is removed.

Figure 32C:
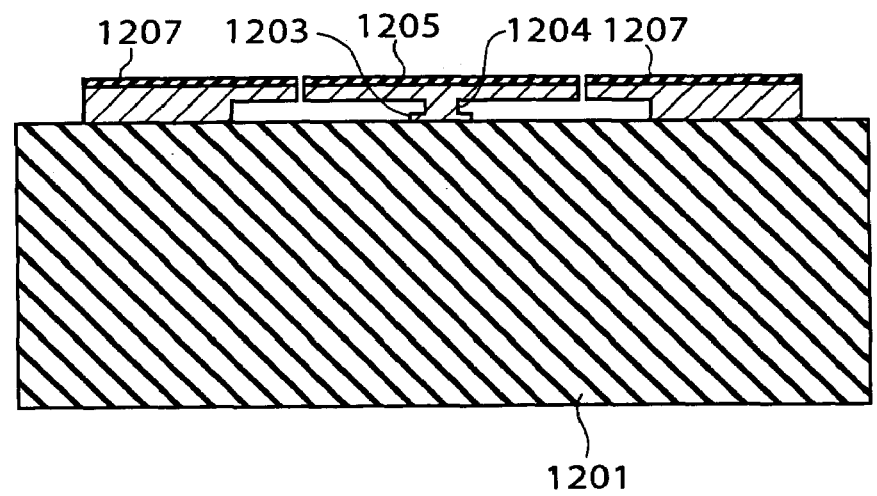

If the above step is completed, with the insulating film 1262 as a mask, the silicon layer 1263 is etched by D-RIE, and, as shown in FIG. 32(C), the output electrode 1203, the supporting portion 1204, the vibration body 1205 and the excitation electrodes 1207 are formed on the substrate 1201. These are the above-mentioned resonator forming steps. If the above step is completed, portions corresponding to the concave portions 1263*a* shown in FIG. 31(B) constitute gaps between the vibration body 1205 and the excitation electrodes 1207, and the substrate 1201. Finally, the micromechanical electrostatic resonator 1200 shown in FIG. 29 is formed.

[Twelfth Exemplary Embodiment]

Figure 33A:
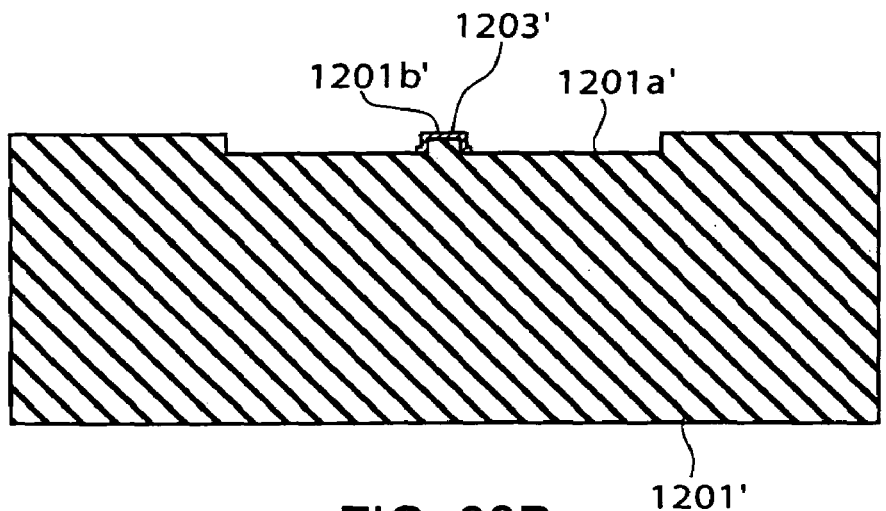
FIGS. 33(A) to 33(C) are schematic diagrams showing a part of a manufacturing method of a twelfth exemplary embodiment.
Figure 33B:
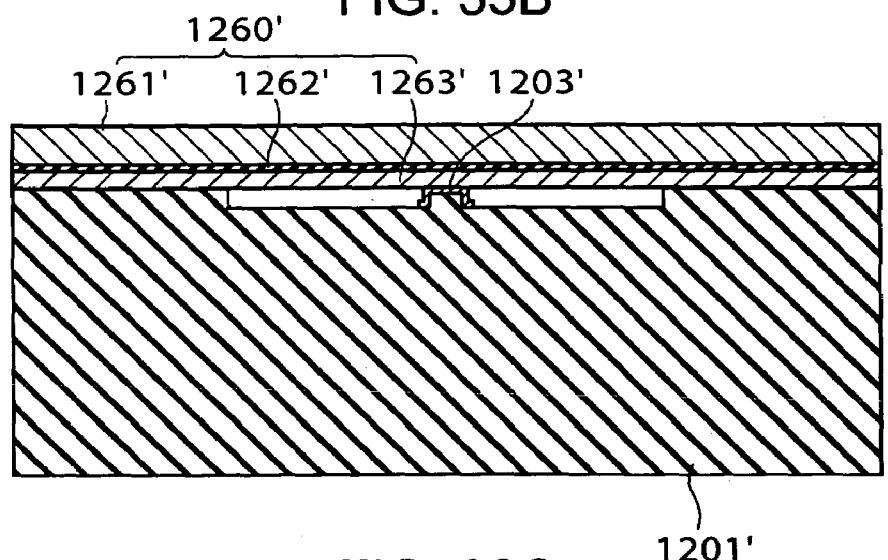
Figure 33C:
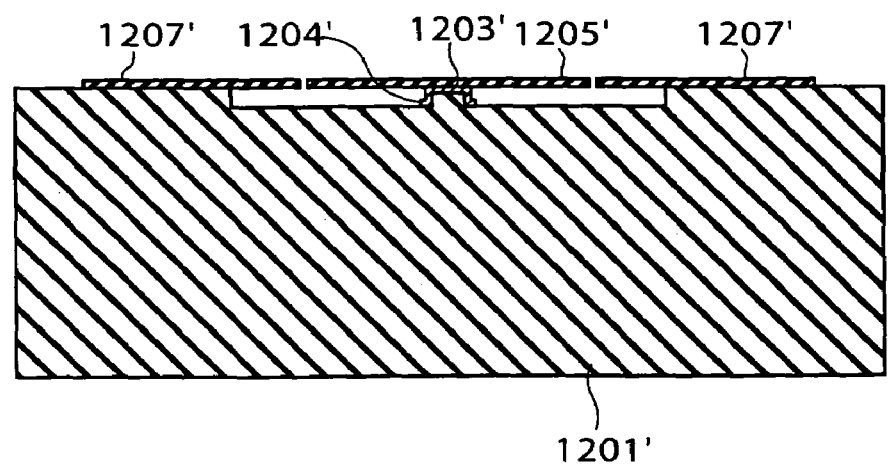

Next, a manufacturing method of a micromechanical electrostatic resonator according to a twelfth exemplary embodiment of the present invention will be described. FIGS. 33A–C are diagrams showing a portion of the manufacturing method of the micromechanical electrostatic resonator according to the present exemplary embodiment. Moreover, in FIG. 33, a symbol ' is attached to the portions corresponding to the portion shown in FIG. 29. In the twelfth exemplary embodiment, similarly to the eleventh exemplary embodiment, an example in which one corresponding to the micromechanical electrostatic resonator 1200 according to the ninth exemplary embodiment is manufactured is shown. Therefore, like the eleventh exemplary embodiment, the present embodiment can be applied to a case in which the micromechanical electrostatic resonator according to other exemplary embodiments are manufactured. Further, similarly to the eleventh exemplary embodiment, in the following description, a case in which the micromechanical electrostatic resonator 1200 is manufactured using a SOI substrate 1260' is exemplified, but, when an insulating film and a polysilicon (p-SiO) film are formed on the silicon substrate 1261', the micromechanical electrostatic resonator 1200 can be manufactured with the almost same steps as those when using the SIO substrate 1260'.

In the present exemplary embodiment, first, as shown in FIG. 33(A), photoresist is coated over an entire surface of the substrate 1201', and an exposure treatment and a development treatment are performed on the photoresist, such that a resist pattern having a predetermined shape is formed. In the resist pattern formed in such a manner, an opening is formed in a portion facing a position of the SOI substrate 1260' at which the resonator structure (vibration body 1205' and excitation electrodes 1207') is to be formed. The SOI substrate 1260' will be cemented in a later step.

Next, with the resist pattern as a mask, an etching treatment is performed on a surface of the substrate 1201', and the surface of the substrate 1201' is removed by several μm. Moreover, a portion 1201*b*' to which a position to be a supporting portion 1204' is joined remains without being removed. If the etching treatment is completed, and then the resist pattern which is formed on the substrate 1201' is removed, an output electrode 1203' is formed in the portion 1201*b*'. The output electrode 1203' may be made of a metallic material such as aluminum or a semiconductor such as polysilicon.

Next, the silicon layer 1263' formed on the SOI substrate 1260' and the surface of the substrate 1201' are joined to face each other by the anodization joining. By this anodization joining, as shown in FIG. 33(B), the SOI substrate 1260' is joined to the substrate 1201'. Moreover, in the present exemplary embodiment, when the SOI substrate 1260' and the substrate 1201' are joined by the anodization joining, the output electrode 1203' or other wiring lines formed on the substrate 1201' is electrically connected to the silicon layer 1263.

If the substrate 1201' and the SOI substrate 1260' are joined, similarly to the above-mentioned exemplary embodiment, a step of removing the silicon substrate 1261' of the SOI substrate 1260', a step of forming a mask for a D-RIE using the insulating film 1262' and a step of etching with the insulating film 1262' as a mask using the D-RIE are performed. As a result, as shown in FIG. 33(C), the vibration body 1205' and the excitation electrodes 1207' are formed, and, finally, a structure substantially equivalent to the micromechanical electrostatic resonator 1200 shown in FIG. 29 is constructed.

As described above, in the present exemplary embodiment, the surfaces of the substrates 1201 and 1201' made of the insulator and the silicon films (active layer) 1263 and 1263' of the SOI substrates 1260 and 1260' are joined to face each other, and various treatments are performed on the SOI substrate 1260 and 1260', such that the resonator structure is formed. Thus, it is possible to efficiently manufacture the micromechanical electrostatic resonator 1200, in which the parasitic capacitance is not generated between the resonator structure and the substrates 1201 and 1201', at low cost.

Further, before the SOI substrates 1260 and 1260' and the substrates 1201 and 1201' are joined, the silicon layers 1263 and 1263' formed on the SOI substrates 1260 and 1260' or the surfaces of the substrates 1201 and 1201' are removed by etching to form the concave portions 1263a and 1201a'. Thus, owing to the concave portions, it is possible to provide extremely easily the gaps between the vibration bodies 1205 and 1205' and the substrates 1201 and 1201'. Further, as the substrate made of the insulator, the glass substrate is used, and thus it is possible to obtain a high-performance micromechanical electrostatic resonator at low manufacturing cost.

What is claimed is:

1. A micromechanical electrostatic resonator, comprising:
    a planar-shaped vibration body;
    a pair of excitation electrodes arranged oppositely to each other at both sides of the vibration body with a gap from an outer circumferential portion of the vibration body;
    a feeding device to apply in-phase alternating-current power to the pair of excitation electrodes; and
    a detecting device to obtain an output corresponding to a change in capacitance between the vibration body and the excitation electrodes,
    the planar shape of the vibration body taking a shape having a curved outline which includes neck portions,
    the outline of the planar shape of the vibration body including circular arc portions and the neck portions, both ends of each of the neck portions being smoothly connected between the circular arc portions.

2. The micromechanical electrostatic resonator according to claim 1,
    the vibration body being supported by a supporting portion formed on a substrate and being constructed in a shape which is stretched in the vicinity of the supporting portion.

3. The micromechanical electrostatic resonator according to claim 2, further comprising:
    a wiring layer conductively connected to at least one of the vibration body and the excitation electrode,
    a distance from the wiring layer to the substrate being larger than a distance from the at least one of vibration body and the excitation electrode to the substrate.

4. The micromechanical electrostatic resonator according to claim 2,
    the substrate being a substrate made of an insulator.

5. The micromechanical electrostatic resonator according to claim 4,
    the substrate being made of glass.

6. The micromechanical electrostatic resonator according to claim 1,
    the vibration body being made of at least one of a silicon layer and a silicon compound layer which is constructed on a silicon substrate serving as the substrate.

7. A micromechanical electrostatic resonator, comprising:
    a planar-shaped vibration body;
    a pair of excitation electrodes arranged oppositely to each other at both sides of the vibration body with a gap from an outer circumferential portion of the vibration body;
    a feeding device to apply in-phase alternating-current power to the pair of excitation electrodes; and
    a detecting device to obtain an output corresponding to a change in capacitance between the vibration body and the excitation electrodes,
    the planar shape of the vibration body taking a shape having a curved outline which includes neck portions
    the vibration body being supported by a supporting portion formed on a substrate and being constructed in a shape which is stretched in the vicinity of the supporting portion,
    a wiring layer conductively connected to at least one of the vibration body and the excitation electrode,
    a distance from the wiring layer to the substrate being larger than a distance from the at least one of vibration body and the excitation electrode to the substrate,
    the wiring layer being formed on an insulating layer which includes a surface spaced from the substrate, farther than a surface on which the at least one of vibration body and the excitation electrode is to be formed.

8. The micromechanical electrostatic resonator according to claim 7,
    at least one of the vibration body and the excitation electrode being constructed on a surface of an insulator which is formed on the substrate and the insulating layer having a dielectric constant lower than the insulator.

9. The micromechanical electrostatic resonator according to claim 7,
    the insulating layer being a porous film.

10. The micromechanical electrostatic resonator according to claim 7,
    a space being provided between the wiring layer and the substrate.

* * * * *